(12) United States Patent
Ishii

(10) Patent No.: US 12,719,436 B2
(45) Date of Patent: Aug. 25, 2026

(54) ACOUSTIC WAVE DEVICE

(71) Applicant: Murata Manufacturing Co., Ltd., Nagaokakyo (JP)

(72) Inventor: Yuta Ishii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 367 days.

(21) Appl. No.: 18/222,499

(22) Filed: Jul. 17, 2023

(65) Prior Publication Data

US 2023/0370047 A1 Nov. 16, 2023

Related U.S. Application Data

(63) Continuation of application No. PCT/JP2022/003811, filed on Feb. 1, 2022.

(Continued)

(51) Int. Cl.
*H03H 9/02* (2006.01)
*H03H 9/17* (2006.01)

(52) U.S. Cl.
CPC ........ *H03H 9/02015* (2013.01); *H03H 9/175* (2013.01)

(58) Field of Classification Search
CPC ........ H03H 9/568; H03H 9/205; H03H 9/542; H03H 9/02015; H03H 9/02062; H03H 9/02157; H03H 9/02228; H03H 9/564

(Continued)

(56) References Cited

U.S. PATENT DOCUMENTS 10,491,192 B1 * 11/2019 Plesski ............... H03H 9/02228
2001/0054941 A1 * 12/2001 Shibata .................. H03H 9/174 333/191

(Continued)

FOREIGN PATENT DOCUMENTS

JP 2010154505 A 7/2010
JP 2011182096 A 9/2011

(Continued)

OTHER PUBLICATIONS

International Search Report in PCT/JP2022/003811, mailed Apr. 12, 2022, 3 pages.

(Continued)

*Primary Examiner* — Andrea Lindgren Baltzell
*Assistant Examiner* — Victor Cole
(74) *Attorney, Agent, or Firm* — Keating & Bennett, LLP

(57) ABSTRACT

An acoustic wave device defining a filter device having a pass band, includes a laminated substrate including first and second layers, a piezoelectric layer laminated on the first layer, and an excitation electrode on the piezoelectric layer. The first layer is a dielectric layer and is included in an intermediate layer laminated on the piezoelectric layer. A thickness of the first layer is defined as td, and combinations of a magnitude relationship of acoustic impedances of the piezoelectric layer and the first and second layers, and the thickness td are as shown in Table 1:

TABLE 1

| Magnitude Relationship of Acoustic Impedance | Zp > Zd | Zp < Zd |
|---|---|---|
| Zs > Zd | td = n (½) λ | td = (2n − 1) (14) λ |
| Zs < Zd | td = (2n − 1) (14) λ | td = n (½) λ. |

17 Claims, 14 Drawing Sheets

Related U.S. Application Data

(60) Provisional application No. 63/144,100, filed on Feb. 1, 2021.

(58) Field of Classification Search
USPC .................................................. 333/186, 187
See application file for complete search history.

(56) References Cited

U.S. PATENT DOCUMENTS

| | | | | |
|---|---|---|---|---|
| 2010/0123367 | A1 | 5/2010 | Tai et al. | |
| 2012/0313483 | A1 | 12/2012 | Matsuda et al. | |
| 2014/0225682 | A1* | 8/2014 | Burak | H03H 9/173 333/187 |
| 2019/0245510 | A1 | 8/2019 | Mimura | |
| 2019/0386633 | A1* | 12/2019 | Plesski | H03H 9/54 |
| 2020/0304096 | A1 | 9/2020 | Suzuki et al. | |

FOREIGN PATENT DOCUMENTS

| | | | |
|---|---|---|---|
| JP | 2012257019 | A | 12/2012 |
| JP | 2019140456 | A | 8/2019 |
| WO | 2016147687 | A1 | 9/2016 |
| WO | 2019123812 | A1 | 6/2019 |

OTHER PUBLICATIONS

Written Opinion in PCT/JP2022/003811, mailed Apr. 12, 2022, 4 pages.

* cited by examiner

FIG. 7
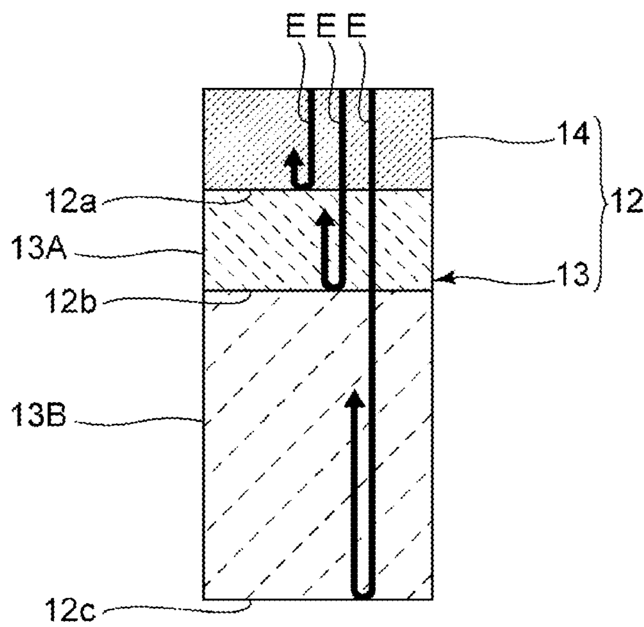
FIG. 8A
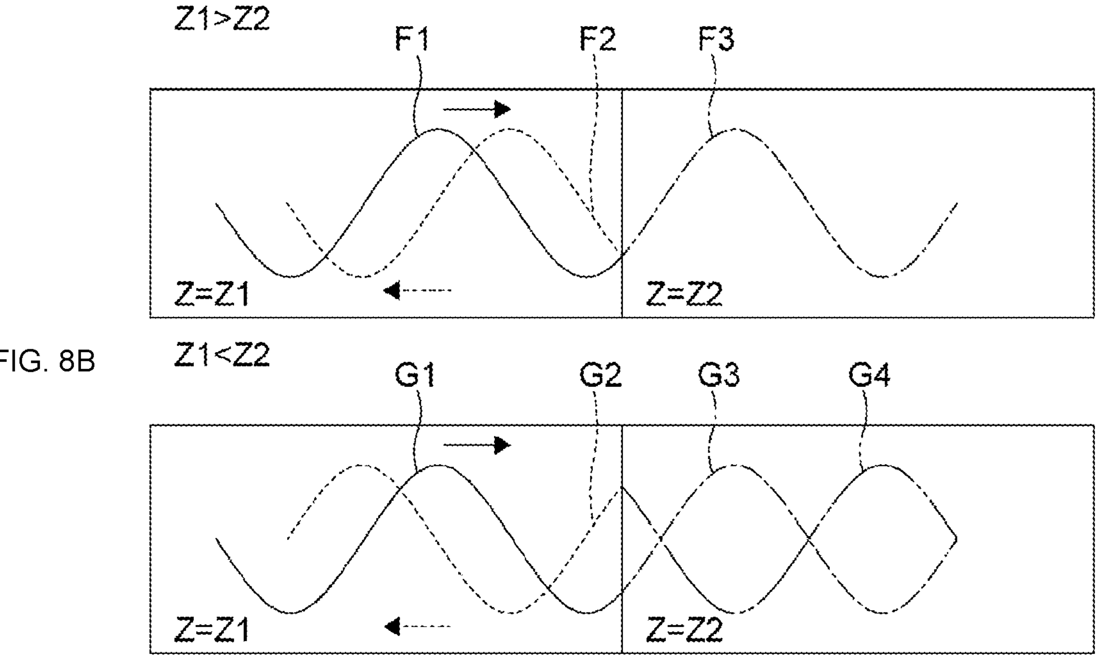
FIG. 8B

ACOUSTIC WAVE DEVICE

CROSS REFERENCE TO RELATED APPLICATIONS

This application claims the benefit of priority to Provisional Application No. 63/144,100 filed on Feb. 1, 2021 and is a Continuation application of PCT Application No. PCT/JP2022/003811 filed on Feb. 1, 2022. The entire contents of each application are hereby incorporated herein by reference.

BACKGROUND OF THE INVENTION

1. Field of the Invention

The present invention relates to an acoustic wave device.

2. Description of the Related Art

There has been known an existing acoustic wave device using plate waves propagating through a piezoelectric film made of $LiNbO_3$ or $LiTaO_3$. For example, Japanese Unexamined Patent Application Publication No. 2012-257019 discloses an acoustic wave device using Lamb waves as plate waves. In this acoustic wave device, a piezoelectric substrate is provided on a support. The piezoelectric substrate is made of $LiNbO_3$ or $LiTaO_3$. An IDT electrode is provided on the upper surface of the piezoelectric substrate. A voltage is applied between a plurality of electrode fingers connected to one potential of the IDT electrode and a plurality of electrode fingers connected to the other potential. This excites Lamb waves. Reflectors are provided on both sides of the IDT electrode. Thus, an acoustic wave resonator using Lamb waves is formed.

Japanese Unexamined Patent Application Publication No. 2011-182096 discloses an example of a ladder filter. In this ladder filter, a plurality of acoustic wave devices are connected to each other by a plurality of wirings. The plurality of wirings include a wiring connected to a hot potential and a wiring connected to a ground potential. The wiring connected to the hot potential and the wiring connected to the ground potential face each other.

In the acoustic wave resonator described in Japanese Unexamined Patent Application Publication No. 2012-257019, unwanted bulk waves may be excited. The bulk waves propagate in a thickness direction of the piezoelectric substrate. Therefore, reflection may occur in a support. When the wirings connected to different potentials face each other as in Japanese Unexamined Patent Application Publication No. 2011-182096, unwanted bulk wave signals may be extracted by one wiring. Alternatively, the unwanted bulk wave signals may be extracted by one of facing busbars. In these cases, ripples may occur in the frequency characteristics of the acoustic wave device.

SUMMARY OF THE INVENTION

Preferred embodiments of the present invention provide acoustic wave devices that are each able to reduce or prevent ripples in frequency characteristics.

An acoustic wave device according to a preferred embodiment of the present invention defining a filter with a pass band includes a laminated substrate including a first layer and a second layer, the first layer laminated on the second layer, a piezoelectric layer laminated on the first layer of the laminated substrate, and an excitation electrode on the piezoelectric layer, wherein the first layer is a dielectric layer and is included in an intermediate layer laminated on the piezoelectric layer, and when an acoustic velocity of a transversal wave propagating through the first layer is defined as v, a frequency included in the pass band of the filter device is defined as f, a wavelength derived from v/f is defined as λ, an acoustic impedance of the piezoelectric layer is defined as Zp, an acoustic impedance of the first layer is defined as Zd, an acoustic impedance of the second layer is defined as Zs, a thickness of the first layer is defined as td, and any one of natural numbers is denoted by n, combinations of a magnitude relationship of acoustic impedances of the piezoelectric layer, the first layer, and the second layer, and the thickness td are as shown in Table 1:

TABLE 1

| Magnitude Relationship of Acoustic Impedance | Zp > Zd | Zp < Zd |
|---|---|---|
| Zs > Zd | td = n (½) λ | td = (2n − 1) (14) λ |
| Zs < Zd | td = (2n − 1) (14) λ | td = n (½) λ. |

According to preferred embodiments of the present invention, it is possible to provide acoustic wave devices that are each able to reduce or prevent ripples in frequency characteristics.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a schematic cross-sectional view of a piezoelectric substrate illustrating that unwanted bulk waves are reflected at each interface between layers.

FIG. 8A is a pattern diagram illustrating reflection of a wave in a case where a wave incident from a layer having an acoustic impedance Z of Z1 on a layer having the acoustic impedance Z of Z2 is reflected at an interface between the above two layers, and Z1>Z2 is satisfied, and FIG. 8B is a pattern diagram illustrating reflection of a wave in a case where a wave incident from a layer having the acoustic impedance Z of Z1 on a layer having the acoustic impedance Z of Z2 is reflected at the interface between the above two layers, and Z1<Z2 is satisfied.

DETAILED DESCRIPTION OF THE PREFERRED EMBODIMENTS

Hereinafter, preferred embodiments of the present invention will be described with reference to the drawings to clarify the present invention.

The preferred embodiments described in this specification are merely examples, and partial replacement or combination of configurations is possible between different preferred embodiments.

Figure 1:
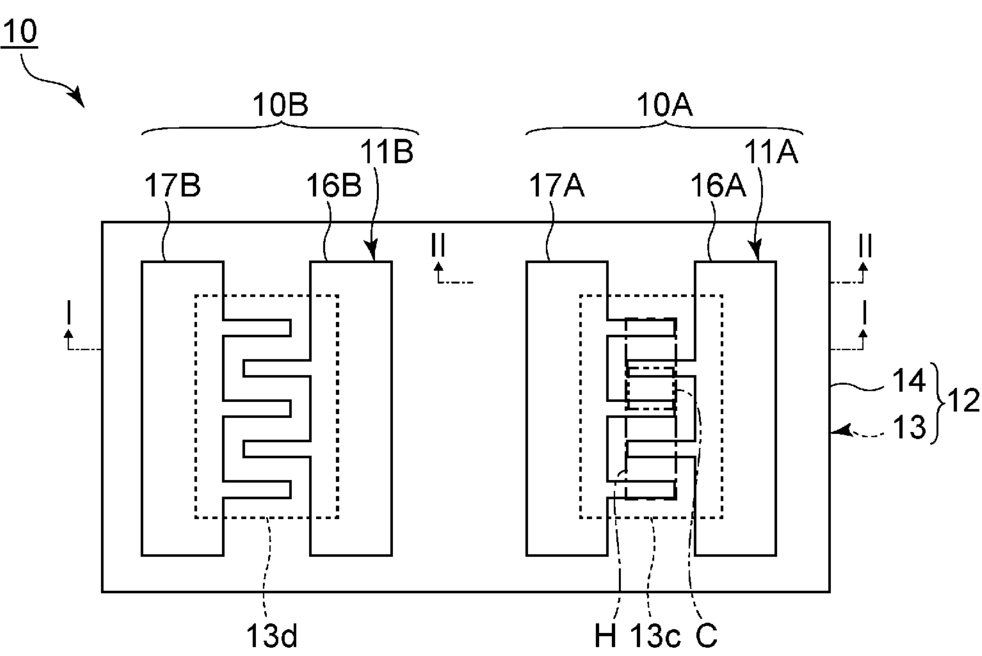
FIG. 1 is a schematic plan view of an acoustic wave device according to a first preferred embodiment of the present invention.
Figure 2:
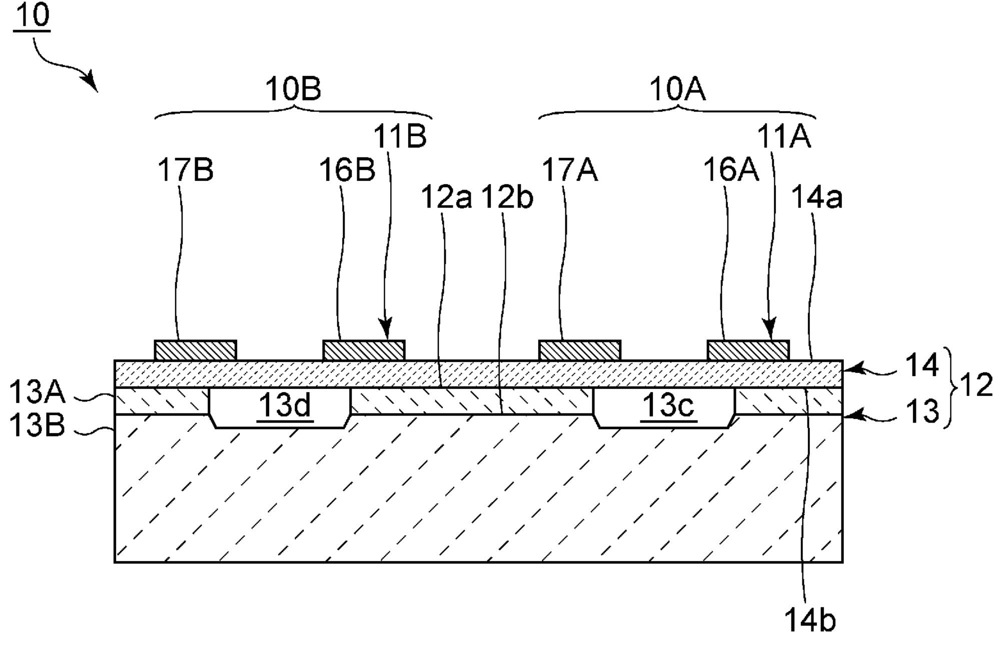
FIG. 2 is a schematic cross-sectional view taken along a line I-I in FIG. 1.

FIG. 1 is a schematic plan view of an acoustic wave device according to a first preferred embodiment of the present invention. FIG. 2 is a schematic cross-sectional view taken along a line I-I in FIG. 1. In FIG. 1, wirings and the like connected to each of IDT electrodes to be described later are omitted.

As illustrated in FIG. 1, an acoustic wave device 10 includes a piezoelectric substrate 12, and a first IDT electrode 11A and a second IDT electrode 11B as an excitation electrode. The first IDT electrode 11A is provided on the piezoelectric substrate 12 to define the first acoustic wave resonator 10A. The second IDT electrode 11B is provided on the piezoelectric substrate 12 to define the second acoustic wave resonator 10B. As described above, the acoustic wave device 10 includes two acoustic wave resonators. However, the acoustic wave device 10 may include at least one acoustic wave resonator.

The acoustic wave device 10 is an acoustic wave device defining a filter device with a pass band. More specifically, the filter device may be, for example, a ladder filter or a filter device including a longitudinally coupled resonator acoustic wave filter. Each acoustic wave resonator of the acoustic wave device 10 may be, for example, a series arm resonator or a parallel arm resonator of the ladder filter. Alternatively, each acoustic wave resonator of the acoustic wave device 10 may be an acoustic wave resonator directly or indirectly connected to a longitudinally coupled resonator acoustic wave filter.

The pass band is a range of frequencies equal to or higher than a low-band cutoff frequency f1L and equal to or lower than a high-band cutoff frequency f1H. The low-band cutoff frequency f1L and the high-band cutoff frequency f1H are two frequencies at which the attenuation amount is larger than the minimum attenuation amount by about 3 dB in the pass attenuation characteristics of the filter device. The high-band cutoff frequency f1H is higher than the low-band cutoff frequency f1L.

As illustrated in FIG. 2, the piezoelectric substrate 12 includes a laminated substrate 13 and a piezoelectric layer 14. The laminated substrate 13 includes a first layer 13A and a second layer 13B. The first layer 13A is laminated on the second layer 13B. The piezoelectric layer 14 is laminated on the first layer 13A. In the acoustic wave device 10, the second layer 13B is a support substrate. The first layer 13A is a dielectric layer and an intermediate layer. The intermediate layer is a layer laminated on the piezoelectric layer 14. In the present preferred embodiment, the intermediate layer is located between the piezoelectric layer 14 and the second layer 13B.

In the present preferred embodiment, the piezoelectric layer 14 is, for example, a lithium niobate layer. The first layer 13A is, for example, a silicon oxide layer. The second layer 13B is, for example, a silicon substrate. To be more specific, the piezoelectric layer 14 is, for example, a $LiNbO_3$ layer and the first layer 13A is, for example, a $SiO_2$ layer. The plane orientation of the silicon substrate as the second layer 13B is (100).

The piezoelectric substrate 12 is a laminated body of layers having different acoustic impedances Z [$kg/m^2 \cdot s$] from each other. The acoustic impedance Z can be said to be a resistance value with respect to sound waves inherent in a substance. To be specific, when a density of a substance is defined as ρ [$kg/m^3$] and an acoustic velocity of bulk waves is defined as $v_b$ [m/s], the acoustic impedance Z is represented by $Z=\rho v_b$. In a solid, two types of bulk waves of longitudinal waves and transversal waves propagate. Thus, each material has the acoustic impedance Z for longitudinal waves and the acoustic impedance Z for transversal waves. The acoustic velocity of the longitudinal wave and the acoustic velocity of the transversal wave are determined by density and elastic modulus. Therefore, it can be said that the acoustic impedance Z is determined by the density and the elastic modulus. Specifically, the elastic modulus is, for example, a Young's modulus, a Poisson's ratio, or the like.

In preferred embodiments of the present invention, attention is paid to the acoustic impedance Z of the transversal wave among the acoustic impedances Z. In Table 2 below, the density of representative materials, the acoustic velocity of the transversal wave and the acoustic impedance Z of the transversal wave are shown. In the following description, the term "acoustic impedance" means the impedance Z of the transversal wave unless otherwise specified.

TABLE 2

| Materials | Density [$10^3$ kg/$m^3$] | Acoustic Velocity of Transversal Wave [m/s] | Acoustic Impedance of Transversal Wave Z [$10^6$ kg/($m^2 \cdot s$)] |
|---|---|---|---|
| Silicon Oxide | 2.19 | 3760 | 8.23 |
| Aluminum Nitride | 3.26 | 6040 | 20.9 |
| Si Angle of Direction (100) | 2.33 | 5843 | 13.61 |
| Crystal (X-Cut) | 2.65 | 5720 | 15.16 |
| Lithium Niobate (Propagation in Z-Cut Depth Direction) | 4.64 | 3581 | 16.61 |
| Silicon Nitride | 3.2 | 5950 | 19.04 |
| Porous Silicon Oxide | 2 | 3150 | 6.3 |
| Hafnium Oxide | 9.68 | 3013 | 29.22 |
| Lithium Tantalate | 8.47 | 2430 | 20.58 |
| Silicon Oxycarbide | 1.5 | 2400 | 2.32 |
| Al | 2.7 | 3221 | 8.7 |
| Pt | 21.45 | 1678 | 36 |
| W | 19.3 | 2885 | 55.68 |

As shown in Table 2, for example, the acoustic impedance of the transversal wave of $LiNbO_3$ is larger than the acoustic impedance of the transversal wave of $SiO_2$. Therefore, when the acoustic impedance of the piezoelectric layer 14 is defined as Zp and the acoustic impedance of the first layer 13A is defined as Zd, Zp>Zd is satisfied in the present preferred embodiment. Further, the acoustic impedance of the transversal wave of Si having the plane orientation (100) is larger than the acoustic impedance of the transversal wave of $SiO_2$. Therefore, when the acoustic impedance of the second layer 13B is defined as Zs, Zs>Zd is satisfied in the present preferred embodiment. However, the material of each layer and the magnitude relationship of the acoustic impedance are not limited to the above.

Referring back to FIG. 1, the first IDT electrode 11A and the second IDT electrode 11B as excitation electrodes are provided on the piezoelectric layer 14. To be more specific, the piezoelectric layer 14 includes a first main surface **14*a* and a second main surface 14*b*. The first main surface 14*a* and the second main surface 14*b* face each other. Of the first main surface 14*a* and the second main surface 14*b*, the second main surface 14*b* is located on the laminated substrate 13 side. The IDT electrodes each are provided on the first main surface 14*a***.

The first IDT electrode 11A includes a first busbar 16A, a second busbar 17A, and a plurality of electrode fingers. The first busbar 16A and the second busbar 17A face each other. Similarly, the second IDT electrode 11B also includes a first busbar 16B, a second busbar 17B, and a plurality of electrode fingers. Each of the first IDT electrode 11A and the second IDT electrode 11B may be defined by a single-layer metallic film or a laminated metallic film.

The first busbar 16A and the second busbar 17A of the first IDT electrode 11A are connected to potentials different from each other. In the present preferred embodiment, the first busbar 16A is connected to a hot potential and the second busbar 17A is connected to a ground potential. Similarly, the first busbar 16B of the second IDT electrode 11B is connected to the hot potential, and the second busbar 17B is connected to the ground potential. However, the potentials to which the respective first busbars and the second busbars are connected are not limited to the above. For example, the first busbar may be connected to the ground potential and the second busbar may be connected to the hot potential.

As illustrated in FIG. 1, the second busbar 17A of the first IDT electrode 11A and the first busbar 16B of the second IDT electrode 11B face each other. The second busbar 17A of the first IDT electrode 11A and the first busbar 16B of the second IDT electrode 11B are connected to potentials different from each other.

Here, an acoustic velocity of the transversal wave propagating through the first layer 13A illustrated in FIG. 2 is defined as v, a frequency included in the pass band of the filter device is defined as f, a wavelength derived from v/f is defined as λ, a thickness of the first layer 13A is defined as td, and any one of natural numbers is denoted by n. The present invention is characterized in that combinations of a magnitude relationship of the acoustic impedances of the piezoelectric layer 14, the first layer 13A, and the second layer 13B and a thickness td are as shown in Table 3. Note that in the present preferred embodiment, Zp>Zd, Zs>Zd, and td=n (½) λ are satisfied. As such, ripples in the frequency characteristics can be reduced or prevented. The details will be described below by referring to a known example and further comparing the present preferred embodiment and a comparative example. In the following description, multiplication by a natural number may be simply referred to as integer multiplication.

TABLE 3

| Magnitude Relationship of Acoustic Impedance | Zp > Zd | Zp < Zd |
|---|---|---|
| Zs > Zd | td = n (½) λ | td = (2n − 1) (14) λ |
| Zs < Zd | td = (2n − 1) (14) λ | td = n (½) λ |

Figures 3, 4:
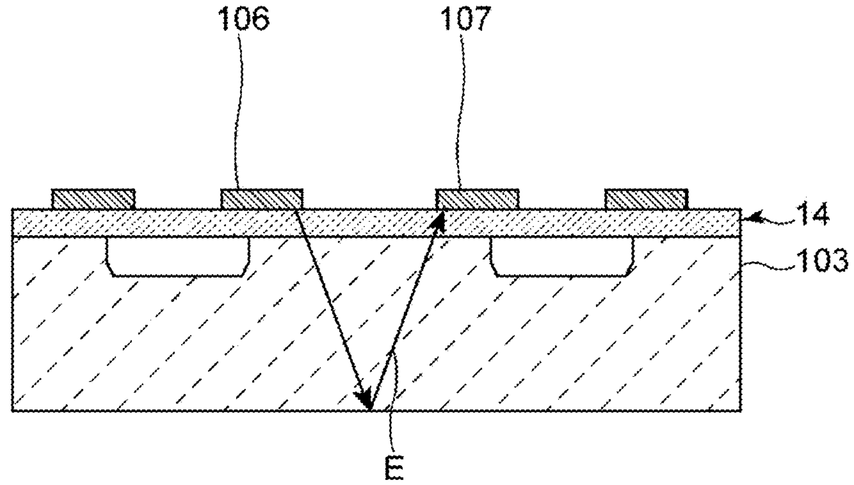
FIG. 3 is a schematic front cross-sectional view for explaining unwanted bulk waves generated in a known example.
FIG. 4 is a diagram illustrating attenuation-frequency characteristics of a filter device in the known example.

FIG. 3 is a schematic front cross-sectional view for explaining unwanted bulk waves generated in the known example.

In the known example illustrated in FIG. 3, the piezoelectric layer 14 is directly laminated on a support substrate 103. A busbar 106 and a busbar 107 connected to different potentials face each other on the piezoelectric layer 14. In such a case, the signal of an unwanted bulk wave E generated from one busbar of the busbar 106 and the busbar 107 may be extracted by the other busbar. More specifically, the unwanted bulk wave E generated from one busbar is reflected by the support substrate 103. Then, the reflected unwanted bulk wave E reaches the other busbar, and the signal of the bulk wave may be extracted. Although FIG. 3 illustrates an example of the busbars, transmission of signals of the unwanted bulk wave E as described above may also occur between the wirings connected to different potentials.

FIG. 4 is a diagram illustrating attenuation-frequency characteristics of the filter device in the known example.

Figure 5:
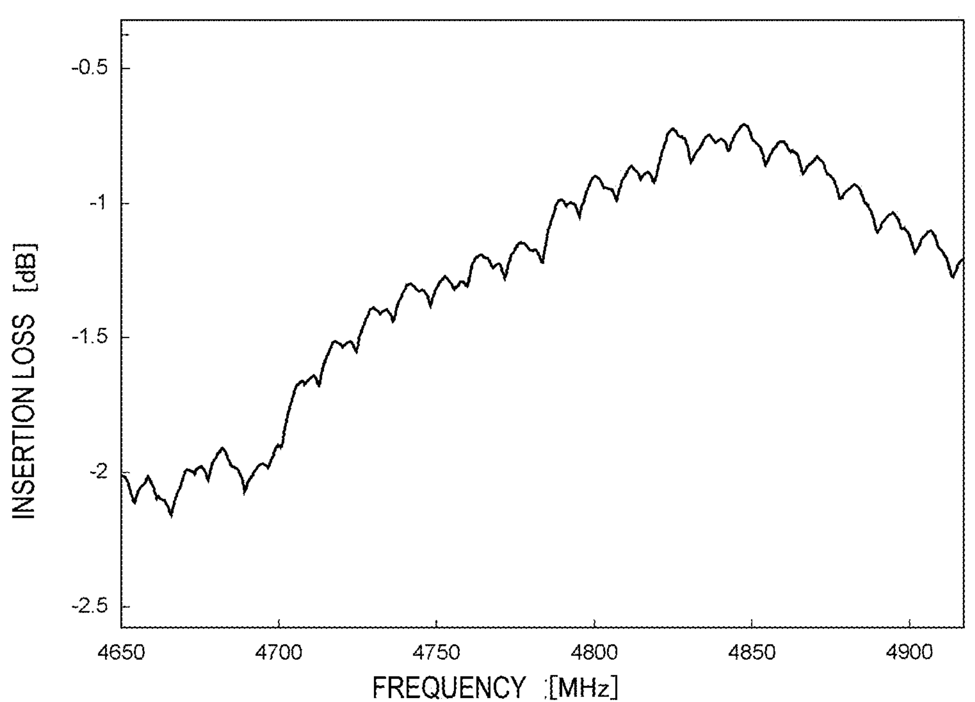
FIG. 5 is an enlarged view of a portion indicated by an alternate long and short dash line in FIG. 4.

FIG. 5 is an enlarged view of a portion indicated by an alternate long and short dash line in FIG. 4.

As illustrated in FIG. 4 and FIG. 5, unwanted bulk waves may occur within the pass band of the filter device. This causes the ripples in the pass band in the frequency characteristics. In the first preferred embodiment, the ripples can be reduced or prevented. This is described below.

An acoustic wave device having the configuration of the first preferred embodiment and an acoustic wave device of the comparative example in which only the thickness td of the first layer defining and functioning as the intermediate layer is different from that of the first preferred embodiment were prepared. More specifically, for example, in the first preferred embodiment, the thickness td of the first layer is about 0.4 μm, and td=n (½) λ is satisfied. On the other hand, in the comparative example, the thickness td of the first layer is about 0.6 μm, and td≠n (½) λ is satisfied. S-parameters were simulated in the acoustic wave devices of the first preferred embodiment and the comparative example.

Figure 6:
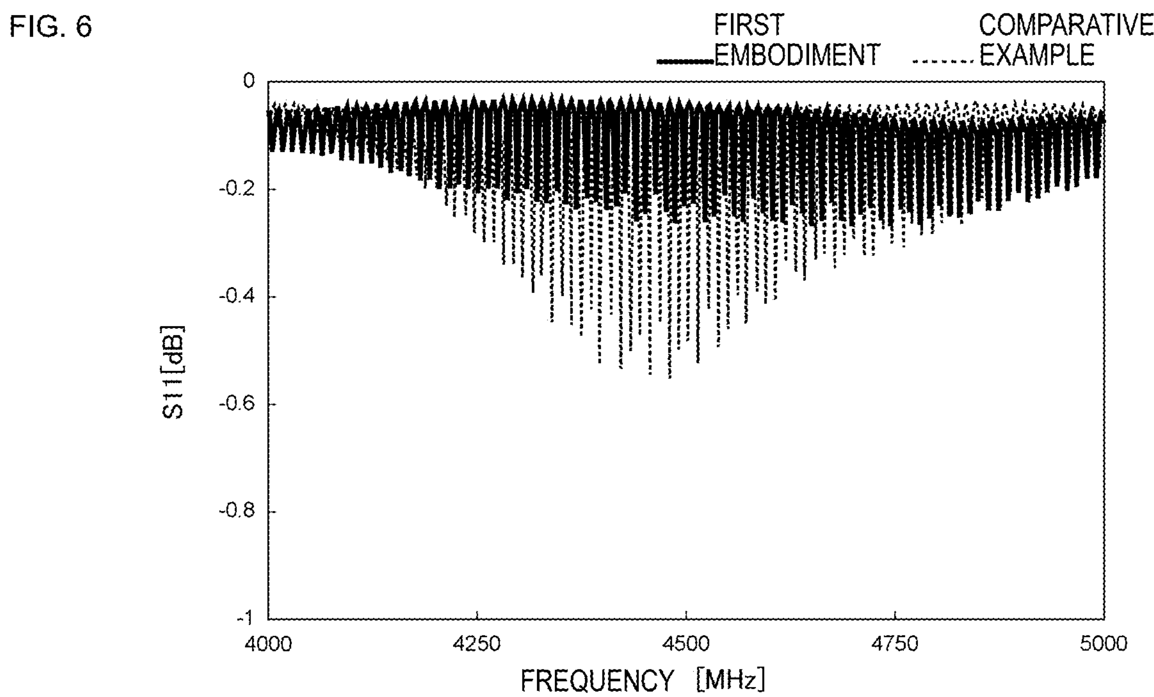
FIG. 6 is a diagram illustrating frequency characteristics of S-parameters in the acoustic wave device according to the first preferred embodiment of the present invention and an acoustic wave device of a comparative example.

FIG. 6 is a diagram illustrating frequency characteristics of S-parameters in the acoustic wave devices of the first preferred embodiment and the comparative example.

As illustrated in FIG. 6, in the comparative example, many ripples having a short period occur in the frequency characteristics. On the other hand, the ripples are more reduced in the first preferred embodiment than in the comparative example. The reason for this will be explained below.

FIG. 7 is a schematic cross-sectional view of the piezoelectric substrate illustrating that unwanted bulk waves are reflected at each interface between layers.

As illustrated in FIG. 7, a portion of the unwanted bulk wave E is reflected at each interface between the layers of the piezoelectric substrate 12. To be more specific, the piezoelectric substrate 12 includes a first interface 12*a*, a second interface 12*b*, and a third interface 12*c*. The first interface 12*a* is an interface between the piezoelectric layer 14 and the first layer 13A. The second interface 12*b* is an interface between the first layer 13A and the second layer 13B. The third interface 12*c* is an interface between the second layer 13B and the air layer. A portion of the unwanted bulk wave E is reflected at each of the first interface 12*a*, the second interface 12*b*, and the third interface 12*c*. In the first preferred embodiment, the thicknesses td of the first layer 13A is set so as to cancel the unwanted bulk wave E reflected at each of the interfaces. Thus, even when the unwanted bulk wave E is generated in one busbar or the like, the unwanted bulk wave E can be reduced or prevented from reaching the other busbar or the like. Details of this will be described below.

FIG. 8A is a pattern diagram illustrating reflection of a wave in a case where a wave incident from a layer having the acoustic impedance Z of Z1 on a layer having the acoustic impedance Z of Z2 is reflected at an interface between the above two layers, and Z1>Z2 is satisfied. FIG. 8B is a pattern diagram illustrating reflection of a wave in the case where a wave incident from a layer having the acoustic impedance Z of Z1 on a layer having the acoustic impedance Z of Z2 is reflected at the interface between the above two layers, and Z1<Z2 is satisfied.

In FIG. 8A, the magnitude relationship between the acoustic impedances is Z1>Z2. In the first preferred embodiment illustrated in FIG. 2, the magnitude relationship between an acoustic impedance Zp of the piezoelectric layer 14 and an acoustic impedance Zd of the first layer 13A is Zp>Zd. Therefore, the reflection of the wave illustrated in FIG. 8A corresponds to the reflection of an unwanted bulk wave at the first interface 12*a* between the piezoelectric layer 14 and the first layer 13A.

In FIG. 8A, an incident wave F1 incident on a layer corresponding to the first layer 13A from a layer corresponding to the piezoelectric layer 14 is indicated by a solid line. A reflected wave F2 obtained when the incident wave F1 is reflected at an interface corresponding to the first interface 12*a* is indicated by a broken line. On the other hand, a virtual wave F3 obtained in the case where the incident wave F1 travels on the assumption that the layer corresponding to the first layer 13A is not provided is indicated by an alternate long and short dash line. The reflected wave F2 is line-symmetric with the virtual wave F3 when the interface is set as an axis of symmetry. Therefore, the phase of the reflected wave F2 and the phase of the virtual wave F3 are the same. The phase of the virtual wave F3 is the same as the phase of the incident wave F1. Therefore, the phase of the reflected wave F2 is the same as the phase of the incident wave F1. Therefore, in the first preferred embodiment, the phase of the unwanted bulk wave incident from the piezoelectric layer 14 is the same as the phase of the unwanted bulk wave reflected at the first interface 12*a*.

On the other hand, in FIG. 8B, the magnitude relationship between the acoustic impedances is Z1<Z2. In the first preferred embodiment, the magnitude relationship between the acoustic impedance Zd of the first layer 13A and the acoustic impedance Zs of the second layer 13B is Zs>Zd. Therefore, the reflection of the wave illustrated in FIG. 8B corresponds to the reflection of the unwanted bulk wave at the second interface 12*b* between the first layer 13A and the second layer 13B.

In FIG. 8B, an incident wave G1 incident on a layer corresponding to the second layer 13B from a layer corresponding to the first layer 13A is indicated by a solid line. A reflected wave G2 obtained when the incident wave G1 is reflected at an interface corresponding to the second interface 12*b* is indicated by a broken line. On the other hand, a virtual wave G3 in the case where the incident wave G1 travels on the assumption that a layer corresponding to the second layer 13B is not provided is indicated by an alternate long and short dash line. Further, a wave G4 obtained by inverting the phase of the virtual wave G3 is indicated by an alternate long and two short dashes line. The reflected wave G2 is line-symmetric with the wave G4 when the interface is set as an axis of symmetry. The phase of the wave G4 is inverted with respect to the phase of the incident wave G1. Therefore, the phase of the reflected wave G2 is inverted with respect to the phase of the incident wave G1. Therefore, in the first preferred embodiment, the phase of the unwanted bulk wave incident from the first layer 13A and the phase of the unwanted bulk wave reflected at the second interface 12*b* have an inverted relationship to each other.

As described above, when the phase of the unwanted bulk wave incident on the first interface 12*a* and the phase of the unwanted bulk wave incident on the second interface 12*b* are the same, the phases of the respective reflected waves reflected at the above interfaces have an inverted relationship to each other. That is, the unwanted bulk wave reflected at the first interface 12*a* and the unwanted bulk wave reflected at the second interface 12*b* cancel each other out. Similarly, when the phase of the unwanted bulk wave incident on the first interface 12*a* and the phase of the unwanted bulk wave incident on the second interface 12*b* are shifted from each other by a half wavelength, the phases of the respective reflected waves reflected at the above interfaces have also an inverted relationship to each other. As such, by setting the thickness td of the first layer 13A to satisfy td=n (½) λ, which is an integer multiple of a half wavelength of the wavelength λ, it is possible to cause the unwanted bulk waves reflected at the respective interfaces to cancel each other out. Accordingly, it is possible to reduce or prevent signals of the unwanted bulk wave from being taken up by the busbar or the wiring. Therefore, the ripples in the frequency characteristics can be reduced or prevented.

In the above description, the case where Zp>Zd and Zs>Zd in Table 3 are satisfied has been described. This is the case where the phase of the wave reflected at one of the first interface 12*a* and the second interface 12*b* is not inverted and the phase of the wave reflected at the other thereof is inverted. The same applies to the case where Zp<Zd and Zs<Zd in Table 3 are satisfied. Therefore, by setting Zp<Zd, Zs<Zd, and td=n (½) λ, the ripples in the frequency characteristics can be reduced or prevented.

On the other hand, when Zp>Zd and Zs<Zd in Table 3 are satisfied, the phases of the reflected waves are inverted at neither the first interface 12*a* nor the second interface 12*b*. In this case, when the phase of the unwanted bulk wave incident on the first interface 12*a* and the phase of the unwanted bulk wave incident on the second interface 12*b* are shifted from each other by about a ¼ wavelength, the phases of the respective reflected waves reflected at the interfaces have an inverted relationship to each other. Similarly, when the phase of the unwanted bulk wave incident on the first interface 12*a* and the phase of the unwanted bulk wave incident on the second interface 12*b* are shifted from each other by about ¾ wavelengths, the phases of the respective reflected waves reflected at the interfaces have an inverted relationship to each other. Therefore, by setting the thickness td of the first layer 13A to satisfy td=(2n−1) (¼) λ, which is an odd multiple of a quarter of the wavelength λ, it is possible to reduce or prevent signals of the unwanted bulk wave from being taken up by the busbar or the wiring. Therefore, the ripples in the frequency characteristics can be reduced or prevented.

When Zp<Zd and Zs>Zd in Table 3 are satisfied, the phases of the waves reflected at both the first interface 12*a* and the second interface 12*b* are inverted. In this case, the condition of the thickness td to cancel the unwanted bulk wave reflected at above each interface is the same or substantially the same as the condition in the case where the phases of the reflected waves are inverted at neither of interfaces described above. That is, by setting Zp<Zd, Zs>Zd, and td=(2n−1) (¼) λ, the ripples in the frequency characteristics can be reduced or prevented.

As described above, the wavelength A is a wavelength derived from v/f, when v is the acoustic velocity of the transversal wave propagating through the first layer 13A illustrated in FIG. 2 and f is the frequency included in the pass band of the filter device. That is, the frequency f is an arbitrary frequency in the pass band, and the wavelength A can take a value in a range corresponding to the range of the frequency f.

Here, the center frequency in the pass band of the filter device in which the acoustic wave device 10 of the present preferred embodiment is used is defined as fc, the acoustic velocity of transversal waves propagating in the first layer 13A serving as the intermediate layer is defined as vi, the thickness of the layer is defined as ti, and any one of natural numbers is denoted by m. The thickness ti is preferably within a range of, for example, (vi/fc)×(½)×(m±0.3). As a result, the ripples in the frequency characteristics can be more reliably and effectively reduced or prevented. This will be explained below.

The thickness of the first layer 13A of the intermediate layer is defined as ti described above, and a relationship between the thickness ti and the intensity of the ripple in the frequency characteristics is derived by simulation.

Figure 9:
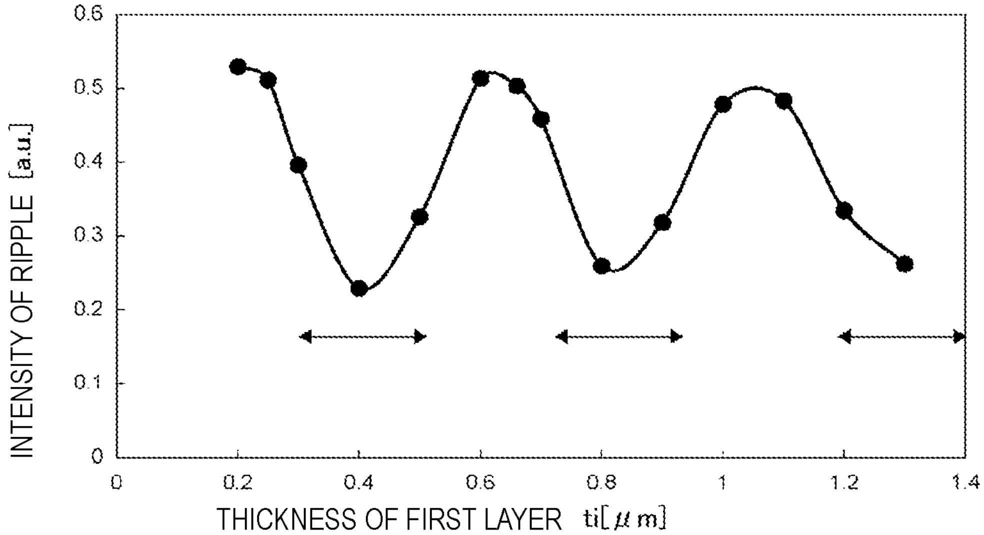
FIG. 9 is a diagram illustrating a relationship between a thickness ti of a first layer which is an intermediate layer and the intensity of the ripple.

FIG. 9 is a diagram illustrating the relationship between the thickness ti of the first layer which is the intermediate layer and the intensity of the ripple.

As illustrated in FIG. 9, it can be seen that the intensity of the ripple periodically takes a minimum value. The period of the thickness ti of the first layer 13A at which the intensity of the ripple becomes the minimum value is (vi/fc)×(½). Therefore, when the thickness ti is an integer multiple of the period, the ripples in the frequency characteristics can be effectively reduced or prevented.

Furthermore, as illustrated in FIG. 9, it can be seen that the intensity of the ripple is small even when the thickness ti is within the range indicated by a double-headed arrow. The range of the thickness ti is a range of, for example, ±about 0.3 times (vi/fc)×(½) centered on the thickness at which the intensity of the ripple becomes the minimum value. Therefore, as described above, the thickness ti is preferably within the range of, for example, (vi/fc)×(½)×(m±0.3). As a result, the ripples in the frequency characteristics can be more reliably and effectively reduced or prevented.

In the following, further details of the configuration of the present preferred embodiment will be described.

As illustrated in FIG. 2, the laminated substrate 13 includes a first cavity portion 13*c*. To be specific, a first through-hole is provided in the first layer 13A. A first recess is provided in the second layer 13B so as to be connected to the first through-hole. The piezoelectric layer 14 is provided on the first layer 13A so as to close the first through-hole. Thus, the first cavity portion 13*c* is provided over the first layer 13A and the second layer 13B. The first cavity portion 13*c* overlaps at least a portion of the first IDT electrode 11A in a plan view.

The laminated substrate 13 includes a second cavity portion 13*d*. Similar to the first cavity portion 13*c*, the second cavity portion 13*d* is also provided over the first layer 13A and the second layer 13B. The second cavity portion 13*d* overlaps at least a portion of the second IDT electrode 11B in a plan view. The first cavity portion 13*c* and the second cavity portion 13*d* open to the piezoelectric layer 14 side. The first cavity portion 13*c* and the second cavity portion 13*d* may be provided only in the first layer 13A or may be provided only in the second layer 13B. Alternatively, each cavity portion may be defined by a recess in the piezoelectric layer 14.

As illustrated in FIG. 1, when a direction in which the plurality of electrode fingers face each other is referred to as an electrode finger facing direction, the electrode finger facing direction is orthogonal or substantially orthogonal to a direction in which the plurality of electrode fingers extends in the first IDT electrode 11A of the present preferred embodiment. When viewed from the electrode finger facing direction, a region where adjacent electrode fingers to each other overlap each other is an overlap region H. The overlap region H is a region including from the electrode finger at one end to the electrode finger at the other end of the first IDT electrode 11A in the electrode finger facing direction. More specifically, the overlap region H includes from an outer end edge portion of the electrode finger at the above one end in the electrode finger facing direction to an outer end edge portion of the electrode finger at the above other end in the electrode finger facing direction.

Furthermore, the first acoustic wave resonator 10A includes a plurality of excitation regions C. By applying an AC voltage to the first IDT electrode 11A, acoustic waves are excited in the plurality of excitation regions C. In the present preferred embodiment, the first acoustic wave resonator 10A is configured such that bulk waves in the thickness-shear mode such as, for example, a first-order thickness-shear mode can be used. Similar to the overlap region H, the excitation region C is a region where adjacent electrode fingers to each other overlap each other when viewed from the electrode finger facing direction. Each excitation region C is a region between a pair of electrode fingers. More specifically, the excitation region C is a region from the center of one electrode finger in the electrode finger facing direction to the center of the other electrode finger in the electrode finger facing direction. Therefore, the overlap region H includes the plurality of excitation regions C. The same applies to the second acoustic wave resonator 10B.

However, the first acoustic wave resonator 10A and the second acoustic wave resonator 10B of the acoustic wave device 10 may be structured to generate plate waves, for example. When each acoustic wave resonator uses plate waves, the overlap region is the excitation region. In this case, as the material of the piezoelectric layer 14, for example, lithium niobate, lithium tantalate, zinc oxide, aluminum nitride, crystal, lead zirconate titanate (PZT), or the like can be used.

In the above description, an example in which transmission of the unwanted bulk wave can be reduced or prevented between the second busbar 17A in the first acoustic wave resonator 10A and the first busbar 16B in the second acoustic wave resonator 10B has been described. The unwanted bulk wave may also be transmitted between the busbars in the same acoustic wave resonator.

Figure 10:
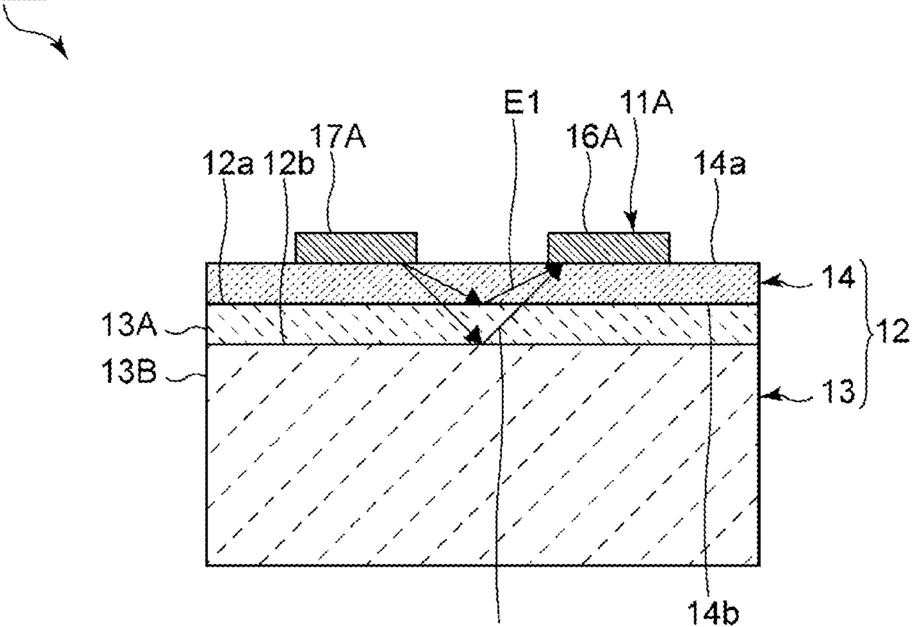
FIG. 10 is a cross-sectional view taken along a line II-II in FIG. 1.

FIG. 10 is a cross-sectional view taken along a line II-II in FIG. 1.

As described above, the first busbar 16A and the second busbar 17A in the first acoustic wave resonator 10A are connected to potentials different from each other. For example, when an unwanted bulk wave is generated from the first busbar 16A, the bulk wave may propagate to the second busbar 17A side. However, in the first preferred embodiment, an unwanted bulk wave E1 reflected at the first interface 12*a* and an unwanted bulk wave E2 reflected at the second interface 12*b* cancel each other out. An acoustic wave device according to a preferred embodiment of the present invention may include a single acoustic wave resonator. Also in this case, it is possible to reduce or prevent the ripples in the frequency characteristics.

Figure 11:
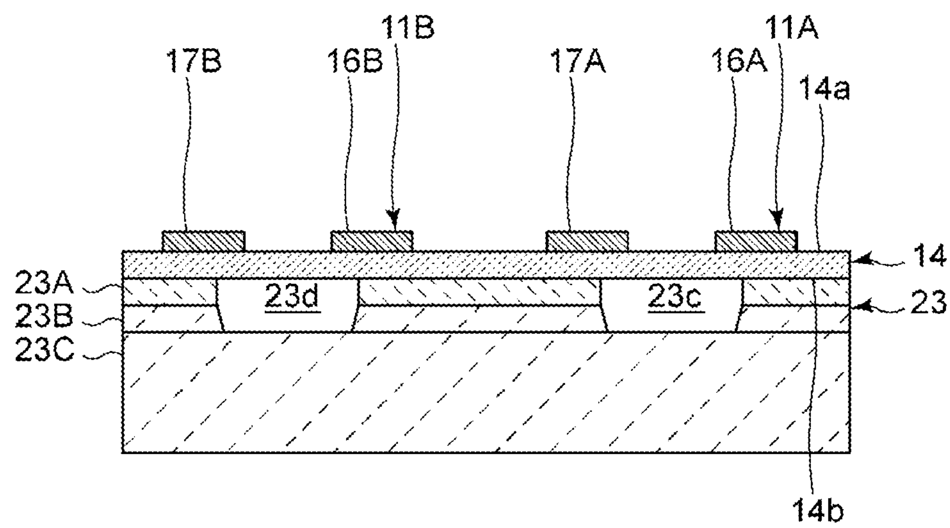
FIG. 11 is a schematic front cross-sectional view of an acoustic wave device according to a second preferred embodiment of the present invention.

FIG. 11 is a schematic front cross-sectional view of an acoustic wave device according to a second preferred embodiment of the present invention.

The present preferred embodiment is different from the first preferred embodiment in that a second layer 23B is included in an intermediate layer and a support substrate 23C is separately provided. The intermediate layer in the present preferred embodiment is a laminated body including a first layer 23A and the second layer 23B. A laminated substrate 23 is a laminated substrate in which the support substrate 23C, the second layer 23B, and the first layer 23A are laminated in this order. Except for the above-described points, the acoustic wave device of the present preferred embodiment has the same or substantially the same configuration as that of the acoustic wave device 10 of the first preferred embodiment.

In the first preferred embodiment, the second layer 13B is the support substrate. On the other hand, in the present preferred embodiment, the second layer 23B is a dielectric layer. A first cavity portion 23*c* in the laminated substrate 23 is defined by a through-hole provided in the intermediate layer. The same applies to a second cavity portion 23*d*. No recess is provided in the support substrate 23C.

Also in the present preferred embodiment, the combinations of the magnitude relationship of the acoustic impedances of the piezoelectric layer 14, the first layer 23A, and the second layer 23B, and the thickness td of the first layer 23A are as shown in Table 3. Therefore, similar to the first preferred embodiment, it is possible to reduce or prevent the ripples in the frequency characteristics.

In the present preferred embodiment, the intermediate layer is, for example, a laminated body including two layers of the first layer 23A and the second layer 23B. However, the number of layers of the intermediate layer is not limited to two. The intermediate layer may include the first layer 23A and the second layer 23B adjacent to the first layer 23A. In a case where the intermediate layer includes three or more layers, the first layer 23A is a layer positioned closest to the piezoelectric layer 14 side among the plurality of layers of the intermediate layer. The second layer 23B is a layer adjacent to the first layer 23A. The above acoustic impedance Zd is the acoustic impedance of the first layer 23A. The above acoustic impedance Zs is the acoustic impedance of the second layer 23B.

At least one layer included in the intermediate layer is preferably, for example, a silicon oxide layer such as a $SiO_2$ layer, or a silicon oxycarbide layer such as SiOC. As illustrated in Table 2, the acoustic impedance of $SiO_2$ is about $8.23\times10^6$ kg/(m$^2$·s), and the acoustic impedance of SiOC is about $2.32\times10^6$ kg/(m$^2$·s). In this way, the acoustic impedance of the layer can be suitably reduced. Therefore, the range of selection of materials satisfying the condition of Zd>Zs or Zd<Zs can be widened.

In the first preferred embodiment, the thickness ti of the first layer 13A which is the intermediate layer is preferably within the range of, for example, (vi/fc)×(½)×(m±0.3). On the other hand, when the intermediate layer is a laminated body, in at least one layer included in the intermediate layer, preferably a thickness ti is in the range of, for example, (vi/fc)×(½)×(m±0.3), when vi is the acoustic velocity of the propagating transversal wave and ti is the thickness of the layer. As a result, the ripples in the frequency characteristics can be more reliably and effectively reduced or prevented as in the preferable case in the first preferred embodiment. This configuration can be applied to configurations of preferred embodiments of the present invention other than the first preferred embodiment and the second preferred embodiment.

Figure 12:
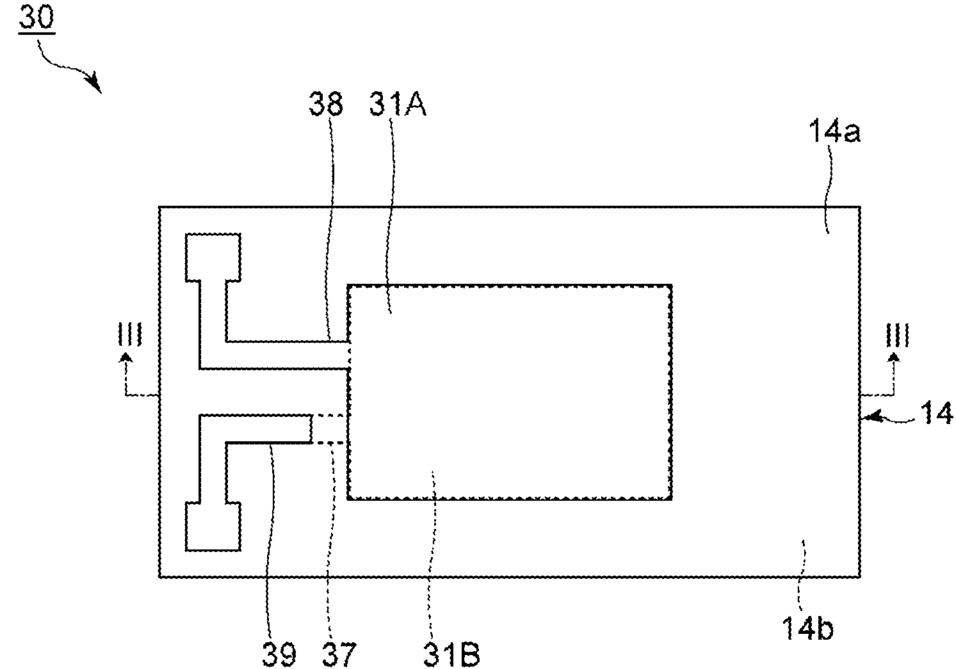
FIG. 12 is a schematic plan view of an acoustic wave device according to a third preferred embodiment of the present invention.
Figure 13:
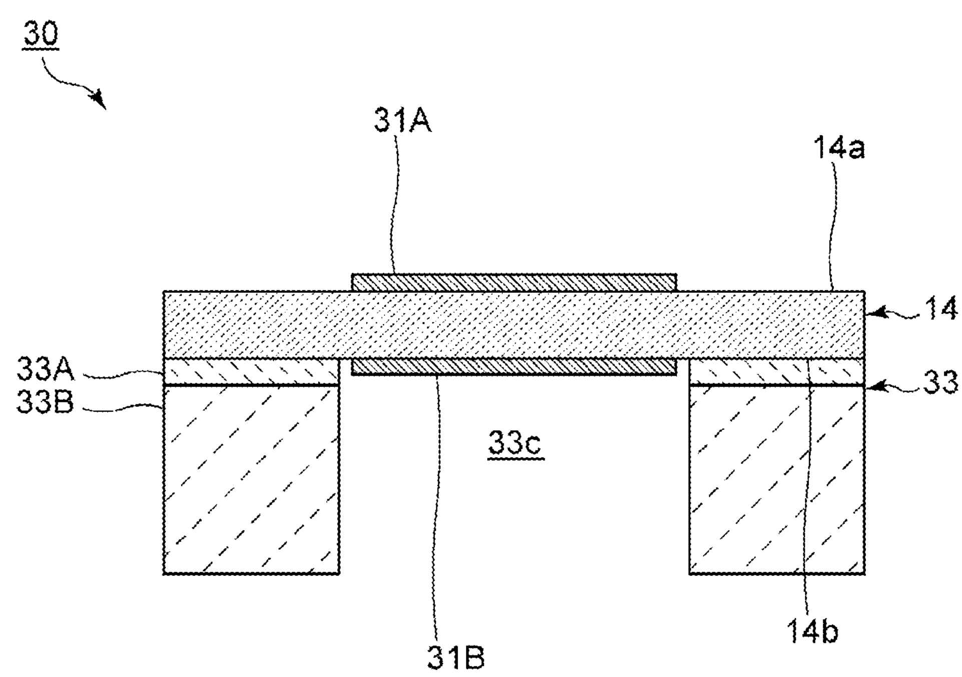
FIG. 13 is a schematic front cross-sectional view taken along a line III-III in FIG. 12.

FIG. 12 is a schematic plan view of an acoustic wave device according to a third preferred embodiment of the present invention. FIG. 13 is a schematic front cross-sectional view taken along a line III-III in FIG. 12.

As illustrated in FIG. 12 and FIG. 13, the present preferred embodiment is different from the first preferred embodiment in that an acoustic wave device 30 is a single acoustic wave resonator and that an excitation electrode includes an upper electrode 31A and a lower electrode 31B. As illustrated in FIG. 13, the present preferred embodiment is also different from the first preferred embodiment in that a cavity portion 33*c* in the laminated substrate 33 is defined by through-holes provided in a first layer 33A and a second layer 33B. Except for the above points, the acoustic wave device 30 of the present preferred embodiment has the same or substantially the same configuration as that of the acoustic wave device 10 of the first preferred embodiment.

The upper electrode 31A is provided on the first main surface 14*a* of the piezoelectric layer 14. The lower electrode 31B is provided on the second main surface 14*b* of the piezoelectric layer 14. The upper electrode 31A and the lower electrode 31B face each other with the piezoelectric layer 14 interposed therebetween. The upper electrodes 31A and the lower electrodes 31B are connected to potentials different from each other. A region where the upper electrode 31A and the lower electrode 31B face each other is an excitation region. By applying an alternating electric field between the upper electrode 31A and the lower electrode 31B, acoustic waves are excited in the excitation region. As described above, the acoustic wave device 30 is a bulk acoustic wave (BAW) element.

As illustrated in FIG. 12, a wiring 38 and a wiring 39 are provided on the first main surface 14*a* of the piezoelectric layer 14. The wiring 38 is connected to the upper electrode 31A. On the other hand, a connection electrode 37 is provided on the second main surface 14*b* of the piezoelectric layer 14. The connection electrode 37 is connected to the lower electrode 31B. A through-hole is provided in the piezoelectric layer 14. The connection electrode 37 is connected to the wiring 39 through the through-hole. Therefore, the wiring 39 is connected to the lower electrode 31B via the connection electrode 37. The wiring 38 and the wiring 39 are connected to potentials different from each other and face each other.

Also in the present preferred embodiment, combinations of a magnitude relationship of the acoustic impedances of the piezoelectric layer 14, the first layer 33A, and the second layer 33B, and a thickness td of the first layer 33A are as shown in Table 3. Therefore, similar to the first preferred embodiment, it is possible to reduce or prevent the ripples in the frequency characteristics.

Hereinafter, a thickness-shear mode and a plate wave will be described in detail. An electrode in the following example corresponds to the electrode finger described above. A support member in the following example corresponds to a support substrate in the present invention.

Figure 14A:
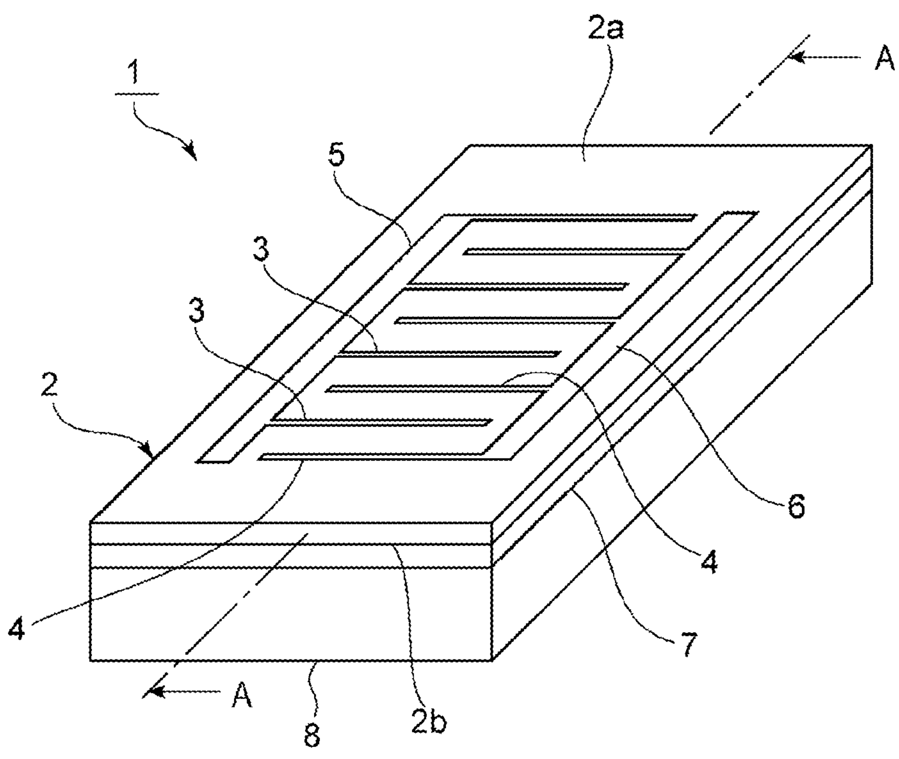
FIG. 14A is a schematic perspective view illustrating an appearance of an acoustic wave device using bulk waves in a thickness-shear mode.
Figure 14B:
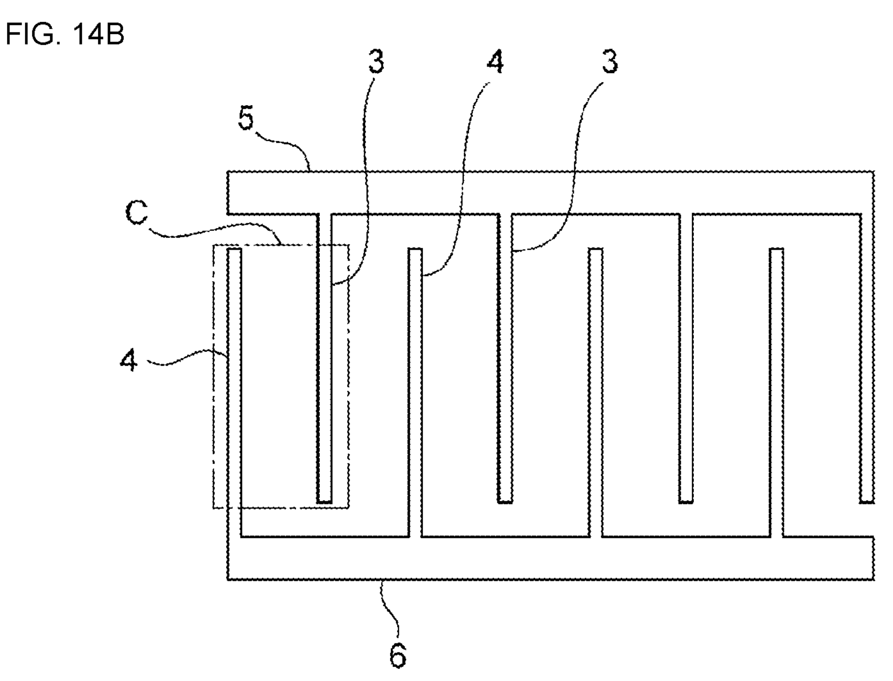
FIG. 14B is a plan view illustrating an electrode structure on a piezoelectric layer.
Figure 15:
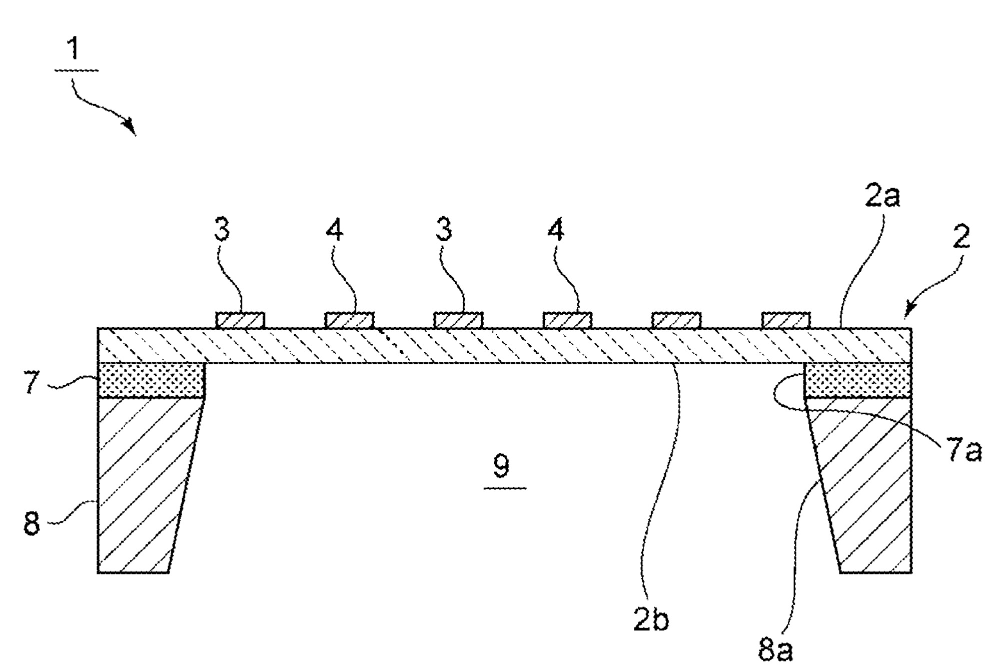
FIG. 15 is a cross-sectional view of a portion taken along a line A-A in FIG. 14A.

FIG. 14A is a schematic perspective view illustrating an appearance of an acoustic wave device using bulk waves in the thickness-shear mode, FIG. 14B is a plan view illustrating an electrode structure on a piezoelectric layer, and FIG. 15 is a cross-sectional view of a portion taken along a line A-A in FIG. 14A.

An acoustic wave device 1 includes a piezoelectric layer 2 made of, for example, $LiNbO_3$. The piezoelectric layer 2 may be made of, for example, $LiTaO_3$. The cut angle of $LiNbO_3$ and $LiTaO_3$ is Z-cut, but may be rotated Y-cut or X-cut. In order to effectively excite the thickness-shear mode, the thickness of the piezoelectric layers 2 is preferably, but not particularly limited, to, for example, equal to or more than about 40 nm and equal to or less than about 1000 nm, and more preferably equal to or more than about 50 nm and equal to or less than about 1000 nm. The piezoelectric layer 2 includes first and second main surfaces 2*a* and 2*b* facing each other. An electrode 3 and an electrode 4 are provided on the first main surface 2*a*. Here, the electrode 3 is an example of a "first electrode", and the electrode 4 is an example of a "second electrode". In FIGS. 14A and 14B, the plurality of electrodes 3 is a plurality of first electrode fingers connected to a first busbar 5. The plurality of electrodes 4 is a plurality of second electrode fingers connected to a second busbar 6. The plurality of electrodes 3 and the plurality of electrodes 4 are interdigitated with each other. The electrode 3 and the electrode 4 have a rectangular or substantially rectangular shape and have a length direction. The electrode 3 and the adjacent electrode 4 face each other in a direction orthogonal or substantially orthogonal to the length direction. The length direction of the electrodes 3 and 4 and the direction orthogonal or substantially orthogonal to the length direction of the electrodes 3 and 4 are both directions intersecting a thickness direction of the piezoelectric layer 2. Therefore, it can also be said that the electrode 3 and the adjacent electrode 4 face each other in the direction intersecting the thickness direction of the piezoelectric layer 2. Further, the length direction of the electrodes 3 and 4 may be replaced with the direction orthogonal or substantially orthogonal to the length direction of the electrodes 3 and 4 illustrated in FIGS. 14A and 14B. That is, in FIGS. 14A and 14B, the electrodes 3 and 4 may be extended in a direction in which the first busbar 5 and the second busbar 6 extend. In this case, the first busbar 5 and the second busbar 6 extend in the direction in which the electrodes 3 and 4 extend in FIGS. 14A and 14B. A plurality of pairs of structures in which the electrode 3 connected to one potential and the electrode 4 connected to the other potential are adjacent to each other is provided in the direction orthogonal or substantially orthogonal to the length direction of the above electrodes 3 and 4. Here, the electrode 3 and the electrode 4 being adjacent to each other refers not to a case where the electrode 3 and the electrode 4 are arranged so as to be in direct contact with each other but to a case where the electrode 3 and the electrode 4 are arranged with an interval therebetween. In addition, when the electrode 3 and the electrode 4 are adjacent to each other, an electrode connected to a hot electrode or a ground electrode, including the other electrodes 3 and 4, is not provided between the electrode 3 and the electrode 4. The number of pairs need not be integer pairs, but may be 1.5 pairs, 2.5 pairs, and the like. A center-to-center distance between the electrodes 3 and 4, that is, a pitch is preferably in a range of, for example, equal to or more than about 1 μm and equal to or less than about 10 μm. In addition, the width of the electrodes 3 and 4, that is, the dimension of the electrodes 3 and 4 in their facing direction is preferably in a range of, for example, equal to or more than about 50 nm and equal to or less than about 1000 nm, and more preferably in a range of equal to or more than about 150 nm and equal to or less than about 1000 nm. The center-to-center distance between the electrodes 3 and 4 is the distance from the center of the dimension (width dimension) of the electrode 3 in the direction orthogonal or substantially orthogonal to the length direction of the electrode 3 to the center of the dimension (width dimension) of the electrode 4 in the direction orthogonal or substantially orthogonal to the length direction of the electrode 4.

In addition, since the acoustic wave device 1 uses a Z-cut piezoelectric layer, the direction orthogonal or substantially orthogonal to the length direction of the electrodes 3 and 4 is a direction orthogonal or substantially orthogonal to a polarization direction of the piezoelectric layer 2. This is not the case when a piezoelectric body having another cut angle is used as the piezoelectric layer 2. Here, "orthogonal" is not limited to strictly orthogonal but may be substantially orthogonal (an angle formed by a direction orthogonal to the length direction of the electrodes 3 and 4 and the polarization direction is within a range of about 90°±10°, for example).

A support member 8 is laminated on the second main surface 2*b* side of the piezoelectric layer 2 via an insulating layer 7. The insulating layer 7 and the support member 8 have a frame shape, and include through-holes 7*a* and 8*a* as illustrated in FIG. 15. Thus, a cavity portion 9 is provided.

The cavity portion 9 is provided so as not to interfere with the vibration of an excitation region C of the piezoelectric layer 2. Therefore, the above support member 8 is laminated on the second main surface 2*b* via the insulating layer 7 at a position not overlapping a portion in which at least the pair of electrodes 3 and 4 are provided. Note that the insulating layer 7 need not be provided. Therefore, the support member 8 can be directly or indirectly laminated on the second main surface 2*b* of the piezoelectric layer 2.

The insulating layer 7 is made of, for example, silicon oxide. However, in addition to silicon oxide, an appropriate insulating material such as, for example, silicon oxynitride, alumina or the like may be used. The support member 8 is made of, for example, Si. The plane orientation of the surface of Si on the piezoelectric layer 2 side may be (100), (110), or (111). It is preferable that Si of the support member 8 have a high resistance of, for example, equal to or higher than the resistivity about 4 kΩ. However, the support member 8 can also be made using an appropriate insulating material or semiconductor material.

As for the material of the support member 8, piezoelectric materials such as, for example, aluminum oxide, lithium tantalate, lithium niobate, crystal and the like; various ceramics such as alumina, magnesia, sapphire, silicon nitride, aluminum nitride, silicon carbide, zirconia, cordierite, mullite, steatite, forsterite and the like; dielectrics such as diamond, glass and the like; and semiconductors such as gallium nitride can be used.

The above plurality of electrodes 3 and 4 and the first and second busbars 5 and 6 are made of an appropriate metal or alloy such as, for example, Al, an AlCu alloy or the like. In the present preferred embodiment, the electrodes 3 and 4 and the first and second busbars 5 and 6 have, for example, a structure in which an Al film is laminated on a Ti film. A close contact layer other than the Ti film may be used.

At the time of driving, an AC voltage is applied between the plurality of electrodes 3 and the plurality of electrodes 4. More specifically, an AC voltage is applied between the first busbar 5 and the second busbar 6. As such, it is possible to obtain resonance characteristics using bulk waves in the thickness-shear mode excited in the piezoelectric layer 2. In addition, in the acoustic wave device 1, when the thickness of the piezoelectric layer 2 is defined as d and the center-to-center distance between any adjacent electrodes 3 and 4 of the plurality of pairs of electrodes 3 and 4 is defined as p, d/p is preferably, for example, equal to or less than about 0.5. Therefore, the bulk wave in the thickness-shear mode is effectively excited, and good resonance characteristics can be obtained. More preferably, for example, d/p is equal to or less than about 0.24, in which case even better resonance characteristics can be obtained.

Since the acoustic wave device 1 has the above-described configuration, even when the number of pairs of the electrodes 3 and 4 is reduced in order to achieve a reduction in size, a decrease in a Q value is less likely to occur. This is because a propagation loss is small even when the number of electrode fingers in the reflectors on both sides is reduced. In addition, the number of above electrode fingers can be reduced because the bulk wave in the thickness-shear mode is used. The difference between Lamb waves used in the acoustic wave device and the bulk waves in the thickness-shear mode will be described with reference to FIGS. 16A and 16B.

Figure 16A:
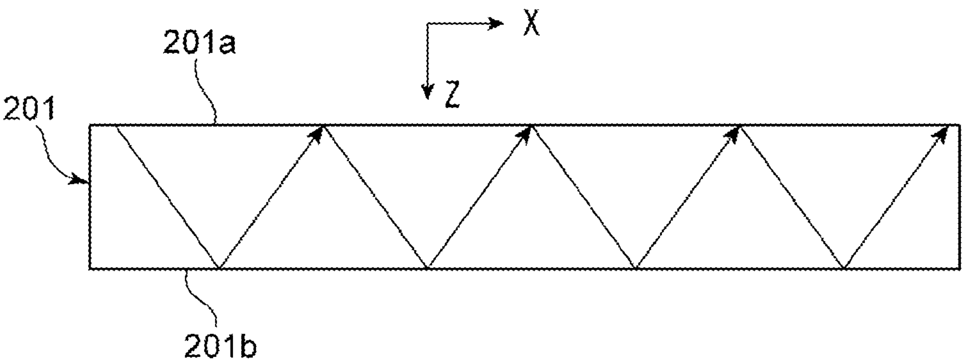
FIG. 16A is a schematic front cross-sectional view for explaining Lamb waves propagating through a piezoelectric film of the acoustic wave device.

FIG. 16A is a schematic front cross-sectional view for explaining Lamb waves propagating through a piezoelectric film of an acoustic wave device as described in Japanese Unexamined Patent Application Publication No. 2012-257019. Here, a wave propagates through a piezoelectric film 201 as indicated by an arrow. Here, in the piezoelectric film 201, a first main surface 201*a* and a second main surface 201*b* face each other, and the thickness direction connecting the first main surface 201*a* and the second main surface 201*b* is a Z direction. An X direction is a direction in which the electrode fingers of the IDT electrode are arranged. As illustrated in FIG. 16A, in the case of the Lamb waves, the wave propagates in the X direction as illustrated. Although the piezoelectric film 201 vibrates as a whole because of the plate wave, since the wave propagates in the X direction, reflectors are arranged on both sides to obtain resonance characteristics. Therefore, the propagation loss of waves occurs, and the Q value decreases when the size is reduced, that is, when the number of pairs of electrode fingers is reduced.

Figure 16B:
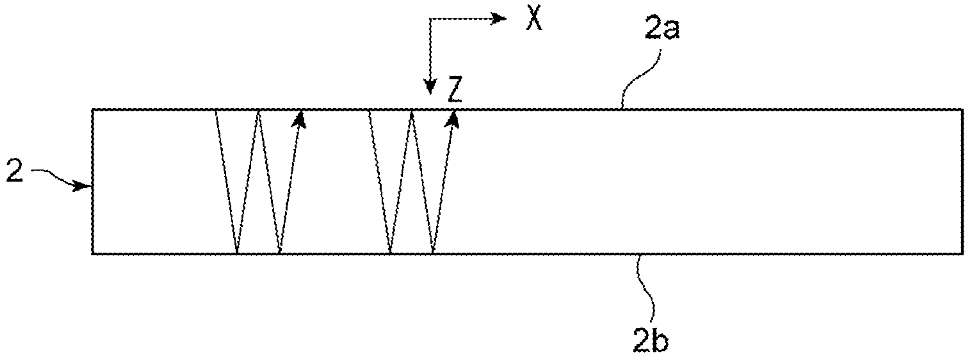
FIG. 16B is a schematic front cross-sectional view for explaining bulk waves in the thickness-shear mode propagating through the piezoelectric film in the acoustic wave device.

On the other hand, as illustrated in FIG. 16B, in the acoustic wave device 1, since vibration displacement is in a thickness-shear direction, the wave propagates substantially in the direction connecting the first main surface 2*a* and the second main surface 2*b* of the piezoelectric layer 2, that is, in the Z direction, and then resonates. That is, an X-direction component of the wave is significantly smaller than a Z-direction component. Since resonance characteristics are obtained by the propagation of the wave in the Z direction, the propagation loss hardly occurs even when the number of electrode fingers of the reflector is reduced. Furthermore, even when the number of electrode pairs constituted of the electrodes 3 and 4 is reduced in order to further reduce the size, the Q value is less likely to decrease.

Figure 17:
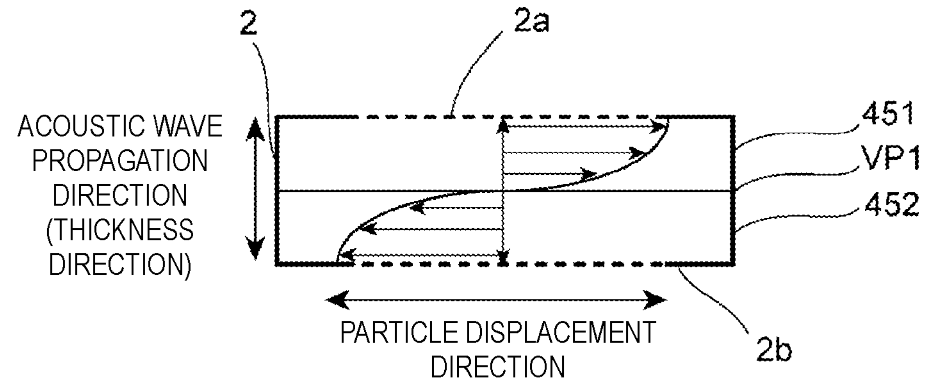
FIG. 17 is a diagram illustrating an amplitude direction of bulk waves in the thickness-shear mode.

As illustrated in FIG. 17, an amplitude direction of the bulk wave in the thickness-shear mode in a first region 451 included in the excitation region C of the piezoelectric layer 2 is opposite to that in a second region 452 included in the excitation region C. FIG. 17 schematically illustrates bulk waves when a voltage is applied between the electrode 3 and the electrode 4 so that the electrode 4 has a higher potential than the electrode 3. The first region 451 is a region of the excitation region C between the first main surface 2*a* and a virtual plane VP1 that is orthogonal to the thickness direction of the piezoelectric layer 2 and divides the piezoelectric layer 2 into two portions. The second region 452 is a region between the virtual plane VP1 and the second main surface 2*b* of the excitation region C.

As described above, in the acoustic wave device 1, at least one pair of electrodes including the electrode 3 and the electrode 4 is provided, however, since waves are not propagated in the X direction, the number of electrode pairs of the electrodes 3 and 4 does not need to be plural. That is, at least one pair of electrodes may be provided.

For example, the electrode 3 is an electrode connected to a hot potential, and the electrode 4 is an electrode connected to a ground potential. However, the electrode 3 may be connected to the ground potential and the electrode 4 may be connected to the hot potential. In the present preferred embodiment, as described above, at least one pair of electrodes is an electrode connected to the hot potential or an electrode connected to the ground potential, and no floating electrode is provided.

Figure 18:
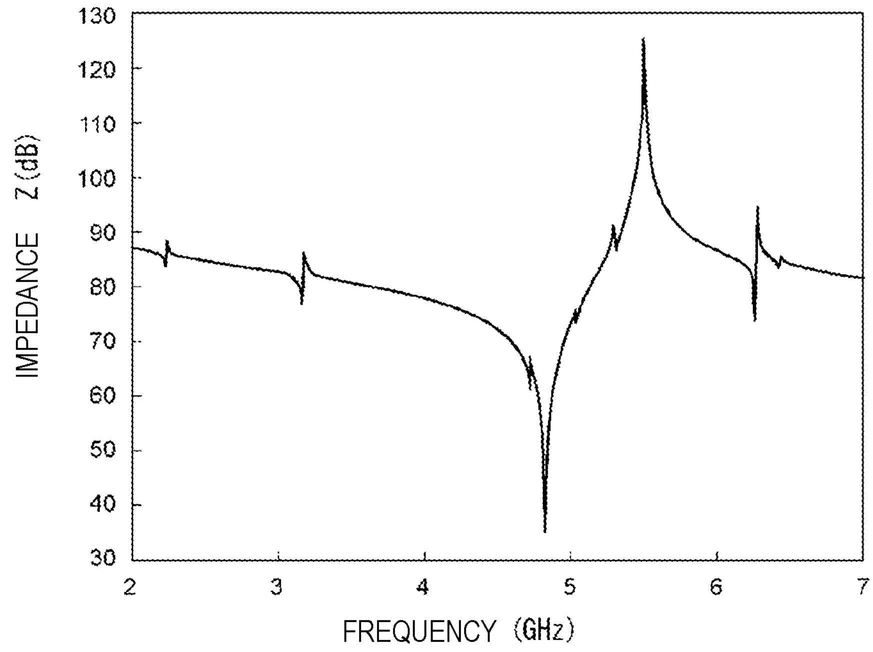
FIG. 18 is a diagram illustrating resonance characteristics of the acoustic wave device using bulk waves in the thickness-shear mode.

FIG. 18 is a diagram illustrating resonance characteristics of the acoustic wave device illustrated in FIG. 15. The design parameters of the acoustic wave device 1 having this resonance characteristic are as follows.

Piezoelectric layer 2: $LiNbO_3$ with Euler angles (0°, 0°, 90°), thickness=about 400 nm.

When viewed in a direction orthogonal or substantially orthogonal to the length direction of the electrode 3 and the electrode 4, the region where the electrode 3 and the electrode 4 overlap, that is, the length of the excitation region C=about 40 μm, the number of electrode pairs constituted of the electrodes 3 and 4=21 pairs, the distance between the centers of the electrodes=3 μm, the width of the electrodes 3 and 4=about 500 nm, d/p=about 0.133.

Insulating layer 7: silicon oxide film with thickness of about 1 μm.

Support member 8: Si.

The length of the excitation region C is a dimension of the excitation region C along the length direction of the electrodes 3 and 4.

In the present preferred embodiment, the inter-electrode distances of the electrode pairs constituted of the electrodes 3 and 4 were all made equal in a plurality of pairs. That is, the electrodes 3 and the electrodes 4 were arranged at equal pitches.

As is clear from FIG. 18, good resonance characteristics with the fractional bandwidth of about 12.5% are obtained even though no reflector is provided.

When the thickness of the piezoelectric layer 2 is defined as d and the center-to-center distance between the electrodes 3 and 4 is defined as p, d/p is preferably, for example, equal to or less than about 0.5 and more preferably equal to or less than about 0.24 in the present preferred embodiment as described above. This will be described with reference to FIG. 19.

Figure 19:
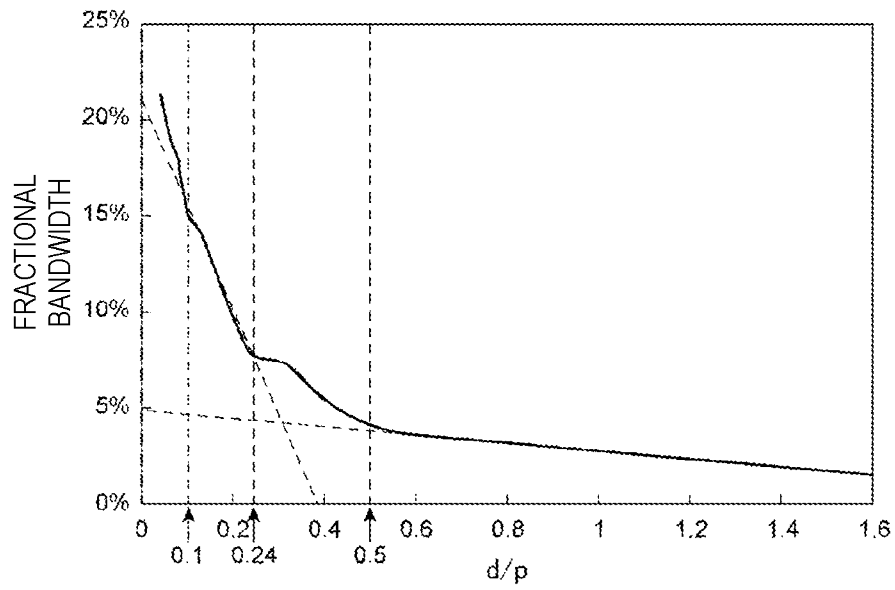
FIG. 19 is a diagram illustrating the relationship between d/p and a fractional bandwidth as a resonator, when p is a center-to-center distance between adjacent electrodes to each other and d is the thickness of the piezoelectric layer.

A plurality of acoustic wave devices was obtained in the same or substantially the same manner as the acoustic wave device having the resonance characteristics illustrated in FIG. 18 except that d/p was changed. FIG. 19 is a diagram illustrating a relationship between d/p and the fractional bandwidth as a resonator of the acoustic wave device.

As is clear from FIG. 19, when d/p>about 0.5, the fractional bandwidth is less than about 5% even when d/p is adjusted. On the other hand, in the case of d/p about 0.5, by changing d/p within the range, the fractional bandwidth of equal to or more than about 5% can be obtained, that is, a resonator having a high coupling coefficient can be formed. Further, in the case of d/p is equal to or less than about 0.24, the fractional bandwidth can be increased to equal to or more than about 7%. In addition, by adjusting d/p within this range, a resonator having a wider fractional bandwidth can be obtained, and a resonator having a higher coupling coefficient can be achieved. Therefore, it is understood that by setting d/p to equal to or less than about 0.5, a resonator having the high coupling coefficient using the bulk wave in the above thickness-shear mode can be provided.

Figure 20:
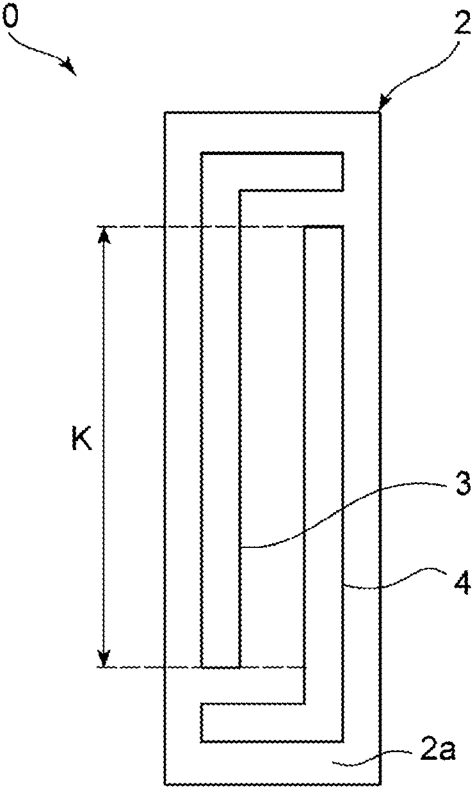
FIG. 20 is a plan view of an acoustic wave device using bulk waves in the thickness-shear mode.

FIG. 20 is a plan view of an acoustic wave device using the bulk wave in the thickness-shear mode. In an acoustic wave device 40, a pair of electrodes including the electrode 3 and the electrode 4 is provided on the first main surface 2*a* of the piezoelectric layer 2. Note that K in FIG. 20 is an overlap width. As described above, in the acoustic wave device according to the present preferred embodiment, the number of pairs of electrodes may be one. Also in this case, when d/p described above is equal to or less than about 0.5, the bulk wave in the thickness-shear mode can be effectively excited.

Figure 21:
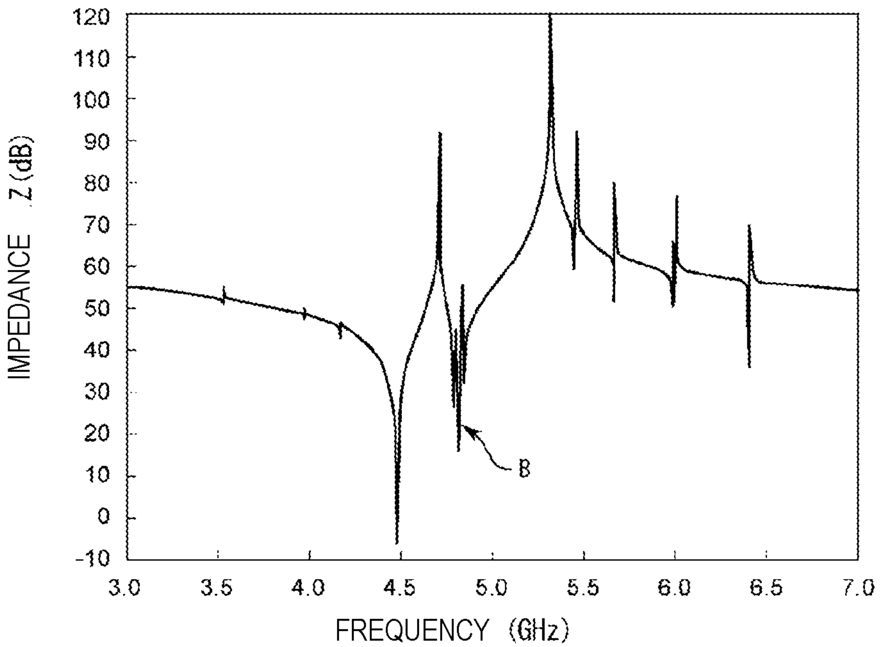
FIG. 21 is a diagram illustrating resonance characteristics of an acoustic wave device of a reference example in which a spurious emission appears.

In the acoustic wave device 1, it is preferable that a metallization ratio MR of any adjacent electrodes 3 and 4 to each other with respect to the excitation region C, which is a region where the plurality of electrodes 3 and 4 overlaps when viewed in a direction in which the adjacent electrodes 3 and 4 face each other, satisfies MR≤1.75 (d/p)+0.075. In this case, a spurious emission can be effectively reduced or prevented. This will be described with reference to FIG. 21 and FIG. 22. FIG. 21 is a reference diagram illustrating an example of resonance characteristics of the above acoustic wave device 1. The spurious emission indicated by an arrow B appears between the resonant frequency and the anti-resonant frequency. Note that d/p=about 0.08 and $LiNbO_3$ with Euler angles of (0°, 0°, 90°) were set. In addition, the above metallization ratio MR=about 0.35 was set.

The metallization ratio MR will be described with reference to FIG. 14B. When attention is paid to the pair of electrodes 3 and 4 in the electrode structure of FIG. 14B, it is assumed that only the pair of electrodes 3 and 4 are provided. In this case, a portion surrounded by an alternate long and short dash line is the excitation region C. The excitation region C is a region in the electrode 3 overlapping the electrode 4, a region in the electrode 4 overlapping the electrode 3, and a region where the electrode 3 and the electrode 4 overlap each other in a region between the electrode 3 and the electrode 4 when the electrode 3 and the electrode 4 are viewed in a direction orthogonal or substantially orthogonal to the length direction of the electrodes 3 and 4, that is, in their facing direction. The area of the electrodes 3 and 4 in the excitation region C with respect to the area of the excitation region C is the metallization ratio MR. That is, the metallization ratio MR is the ratio of the area of the metallization portion with respect to the area of the excitation region C.

When a plurality of pairs of electrodes is provided, the rate of the metallization portion included in the entire excitation region with respect to the sum of the areas of the excitation region may be defined as MR.

Figure 22:
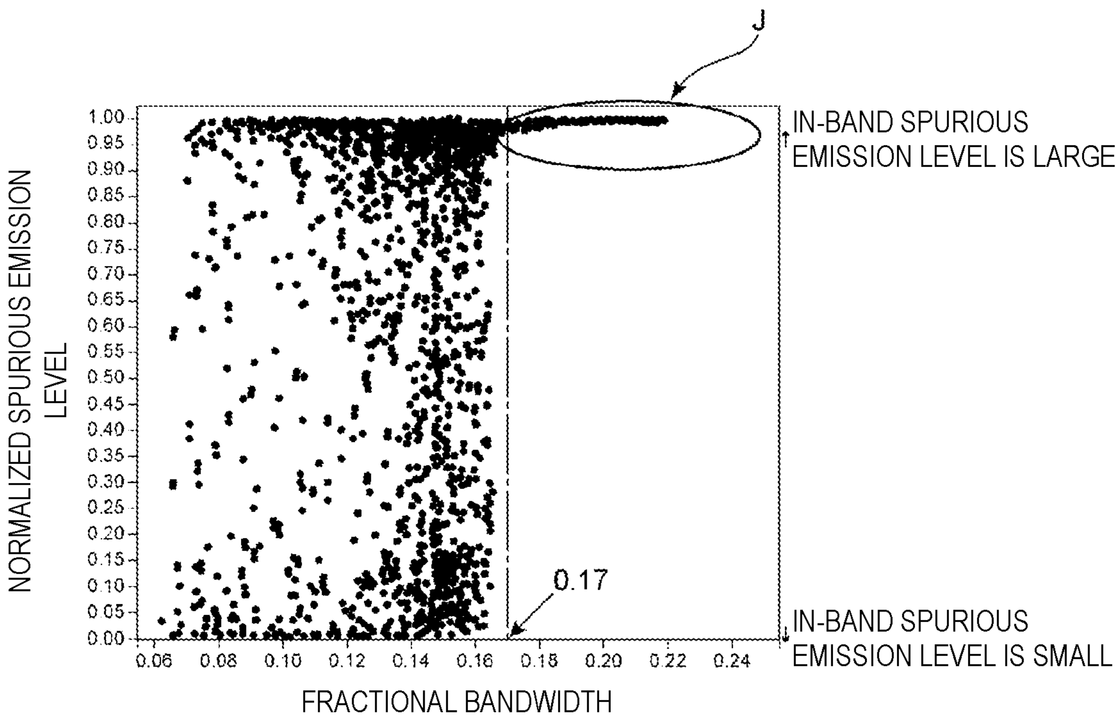
FIG. 22 is a diagram illustrating a relationship between the fractional bandwidth and a phase rotation amount of a spurious emission impedance normalized by 180 degrees as the magnitude of a spurious emission.

FIG. 22 is a diagram illustrating a relationship between the fractional bandwidth and the phase rotation amount of the spurious emission impedance normalized by about 180 degrees as the magnitude of the spurious emission when a large number of acoustic wave resonators are constituted according to the present preferred embodiment. The fractional bandwidth was adjusted by variously changing the thickness of the piezoelectric layer and the dimension of the electrode. In addition, although FIG. 22 illustrates the result in the case of using the piezoelectric layer made of the Z-cut $LiNbO_3$, the same or substantially the same tendency is obtained even in the case of using the piezoelectric layer having another cut angle.

In a region surrounded by an ellipse J in FIG. 22, the spurious emission is as large as about 1.0. As is clear from FIG. 22, when the fractional bandwidth exceeds about 0.17, that is, when the fractional bandwidth exceeds about 17%, a large spurious emission having a spurious level of about 1 or more appears in the pass band even when the parameters constituting the fractional bandwidth are changed. That is, as in the resonance characteristics illustrated in FIG. 21, the large spurious emission indicated by the arrow B appears in the band. Therefore, the fractional bandwidth is preferably, for example, equal to or less than about 17%. In this case, the spurious emission can be reduced by adjusting the thickness of the piezoelectric layer 2, the dimension of the electrodes 3 and 4, and the like.

Figure 23:
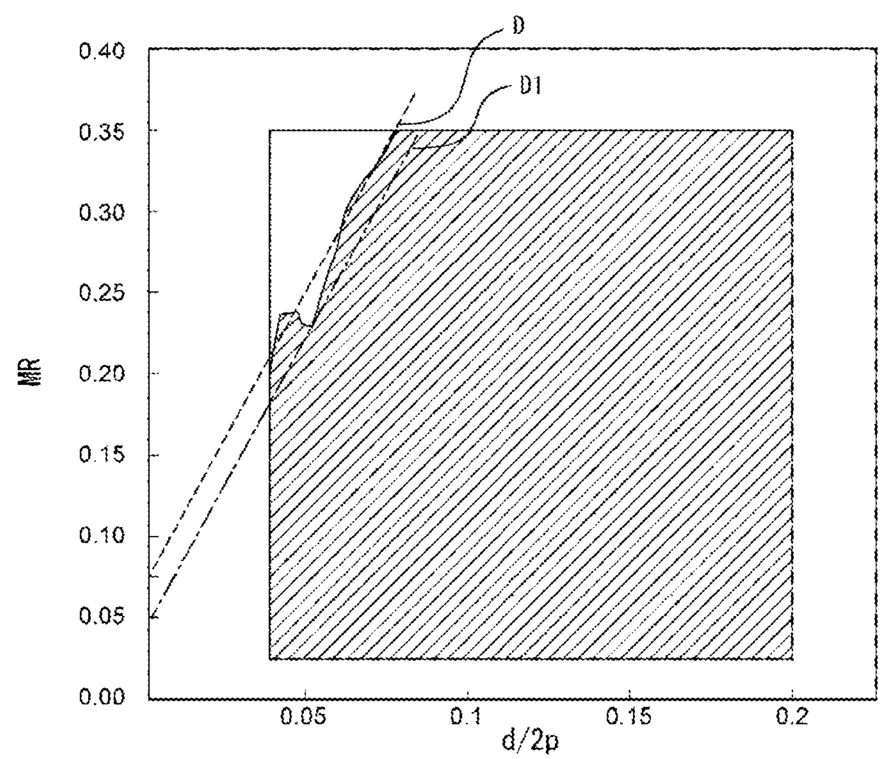
FIG. 23 is a diagram illustrating a relationship between d/2p and a metallization ratio MR.

FIG. 23 is a diagram illustrating a relationship between d/2p, the metallization ratio MR, and the fractional bandwidth. In the above acoustic wave device, various acoustic wave devices having different d/2p and different MRs were produced, and the fractional bandwidth was measured. A hatched portion on the right side of a broken line D in FIG. 23 is a region where the fractional bandwidth is equal to or less than about 17%. The boundary between the hatched region and the non-hatched region is represented by MR=about 3.5 (d/2p)+0.075. That is, MR=about 1.75 (d/p)+

0.075. Therefore, MR≤about 1.75 (d/p)+0.075 is preferably satisfied. In this case, the fractional bandwidth is likely to be equal to or less than about 17%. More preferably, it is the region on the right side of MR=about 3.5 (d/2p)+0.05 indicated by an alternate long and short dash line D1 in FIG. 23. That is, when MR≤about 1.75 (d/p)+0.05 is satisfied, the fractional bandwidth can be reliably made to equal to or less than about 17%.

Figure 24:
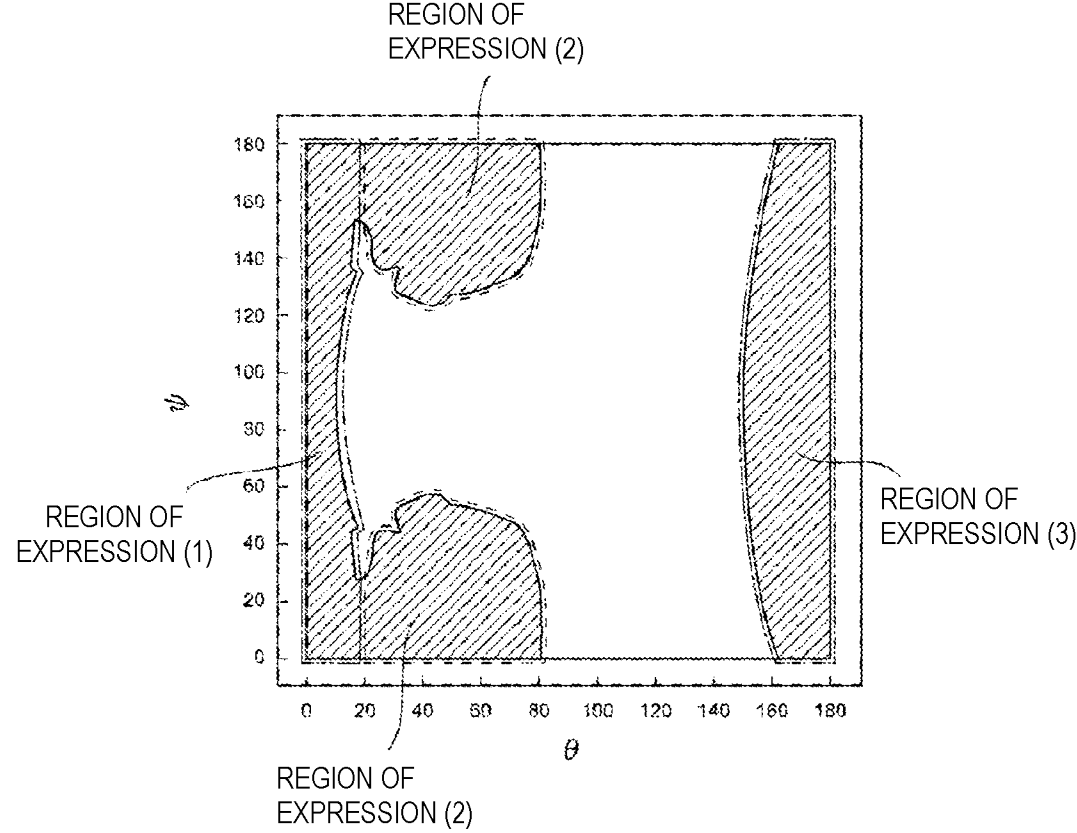
FIG. 24 is a diagram illustrating a map of the fractional bandwidth with respect to the Euler angles (0°, θ, ψ) of $LiNbO_3$ when d/p is made as close to 0 as possible.

FIG. 24 is a diagram illustrating a map of the fractional bandwidth with respect to the Euler angles (0°, θ, ψ) of $LiNbO_3$ when d/p is made as close to 0 as possible. A hatched portion in FIG. 24 is a region in which the fractional bandwidth of at least equal to or more than 5% is obtained, and when the range of the region is approximated, the range is represented by the following Expression (1), Expression (2), and Expression (3).

$$(0°\pm10°, 0° \text{ to } 20°, \text{arbitrary } \psi) \quad \text{Expression (1)}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad \text{Expression (2)}$$

$$(0°\pm10°, [180°-30° (1-(\psi-90)^2/8100)^{1/2}] \text{ to } 180°, \text{arbitrary } \psi) \quad \text{Expression (3)}$$

Therefore, in the case of the Euler angle range of the above Expression (1), Expression (2) or Expression (3), the fractional bandwidth can be sufficiently widened, which is preferable. The same applies to the case where the piezoelectric layer 2 is, for example, a lithium tantalate layer.

Figure 25:
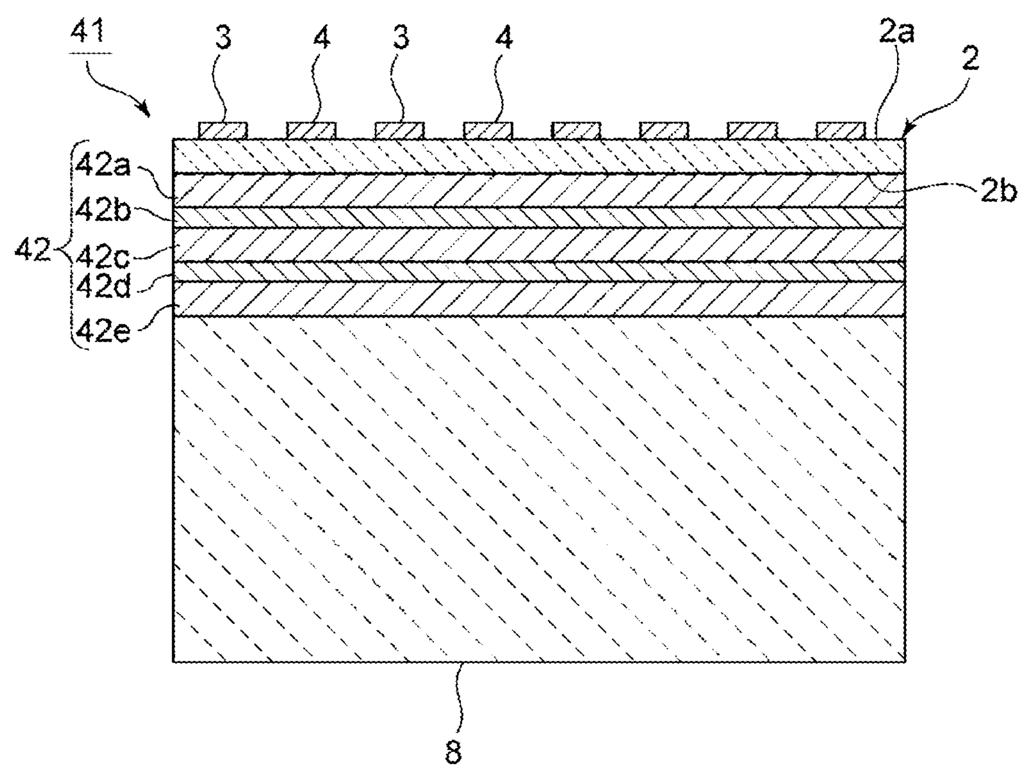
FIG. 25 is a front cross-sectional view of an acoustic wave device including an acoustic multilayer film according to a preferred embodiment of the present invention.

FIG. 25 is a front cross-sectional view of an acoustic wave device including an acoustic multilayer film.

In an acoustic wave device 41, an acoustic multilayer film 42 is laminated on the second main surface 2*b* of the piezoelectric layer 2. The acoustic multilayer film 42 has a laminated structure including low acoustic impedance layers 42*a*, 42*c*, and 42*e* having relatively low acoustic impedance and high acoustic impedance layers 42*b* and 42*d* having relatively high acoustic impedance. When the acoustic multilayer film 42 is used, the bulk wave in the thickness-shear mode can be confined in the piezoelectric layer 2 without using the cavity portion 9 in the acoustic wave device 1. In the acoustic wave device 41 as well, by setting d/p to, for example, equal to or less than about 0.5, resonance characteristics based on the bulk wave in the thickness-shear mode can be obtained. In the acoustic multilayer film 42, the number of laminated layers of the low acoustic impedance layers 42*a*, 42*c*, and 42*e* and the high acoustic impedance layers 42*b* and 42*d* is not particularly limited. At least one of the high acoustic impedance layers 42*b* and 42*d* may be arranged on the side farther from the piezoelectric layer 2 than the low acoustic impedance layers 42*a*, 42*c*, and 42*e*.

The low acoustic impedance layers 42*a*, 42*c*, and 42*e* and the high acoustic impedance layers 42*b* and 42*d* can be made of an appropriate material as long as the relationship of the above acoustic impedance is satisfied. Examples of the material of the low acoustic impedance layers 42*a*, 42*c*, and 42*e* include silicon oxide, silicon oxynitride, and the like. In addition, examples of the material of the high acoustic impedance layers 42*b* and 42*d* include alumina, silicon nitride, and metals.

Figure 26:
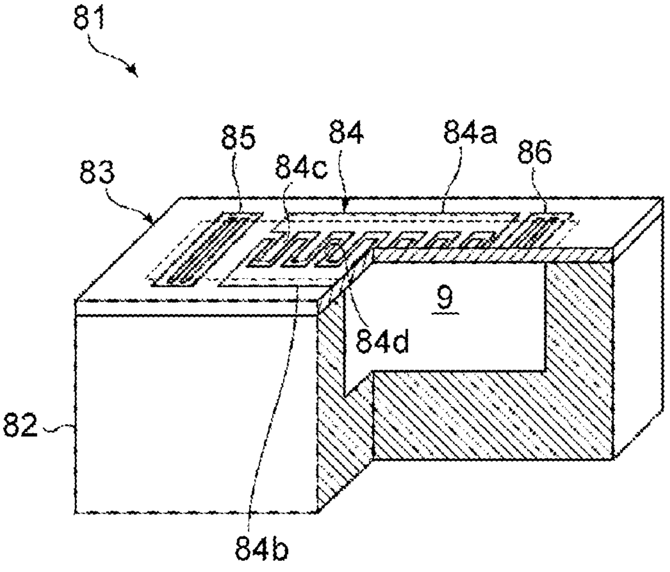
FIG. 26 is a partially cutaway perspective view for explaining an acoustic wave device using Lamb waves according to a preferred embodiment of the present invention.

FIG. 26 is a partially cutaway perspective view for explaining an acoustic wave device according to a preferred embodiment of the present invention that uses Lamb waves.

An acoustic wave device 81 includes a support substrate 82. The support substrate 82 is provided with a recess that is open to the upper surface. A piezoelectric layer 83 is laminated on the support substrate 82. Thus, the cavity portion 9 is provided. An IDT electrode 84 is provided on the piezoelectric layer 83 above the cavity portion 9. Reflectors 85 and 86 are provided on both sides of the IDT electrode 84 in an acoustic wave propagation direction. In FIG. 26, the outer peripheral edge of the cavity portion 9 is indicated by a broken line. Here, the IDT electrode 84 includes first and second busbars 84*a* and 84*b*, a plurality of first electrode fingers 84*c*, and a plurality of second electrode fingers 84*d*. The plurality of first electrode fingers 84*c* is connected to the first busbar 84*a*. The plurality of second electrode fingers 84*d* is connected to the second busbar 84*b*. The plurality of first electrode fingers 84*c* and the plurality of second electrode fingers 84*d* are interdigitated with each other.

In the acoustic wave device 81, the Lamb wave as the plate wave is excited by applying an alternating electric field to the IDT electrode 84 on the above cavity portion 9. Since the reflectors 85 and 86 are provided on both sides, resonance characteristics due to the above Lamb wave can be obtained.

As described above, the acoustic wave resonator in the acoustic wave device may use the plate waves. In this case, the IDT electrode 84, the reflector 85, and the reflector 86 illustrated in FIG. 26 may be provided on the piezoelectric layer in the first preferred embodiment or the second preferred embodiment described above.

In the acoustic wave device of the first preferred embodiment or the second preferred embodiment including the acoustic wave resonator that uses the bulk wave in the thickness-shear mode, d/p is preferably, for example, equal to or less than about 0.5, and more preferably equal to or less than about 0.24, as described above. As a result, even better resonance characteristics can be obtained. Furthermore, in the acoustic wave device of the first preferred embodiment or the second preferred embodiment having the acoustic wave resonator that uses the bulk wave in the thickness-shear mode, it is preferable, for example, that MR≤about 1.75 (d/p)+0.075 be satisfied as described above. In this case, the spurious emission can be more reliably reduced or prevented.

The piezoelectric layer in the acoustic wave device of the first preferred embodiment or the second preferred embodiment including the acoustic wave resonator that uses the bulk wave in the thickness-shear mode is preferably, for example, a lithium niobate layer or a lithium tantalate layer. Preferably, the Euler angles (φ, θ, ψ) of lithium niobate or lithium tantalate constituting the piezoelectric layer are in the range of the above Expression (1), Expression (2) or Expression (3). In this case, the fractional bandwidth can be sufficiently widened.

A laminated substrate according to a preferred embodiment of the present invention may include the acoustic multilayer film 42 illustrated in FIG. 25. To be more specific, for example, the acoustic multilayer film 42 may be provided between the support substrate 23C and the piezoelectric layer 14 illustrated in FIG. 11. The acoustic multilayer film 42 and the intermediate layer may be integrated with each other. More specifically, the layer closest to the piezoelectric layer 14 in the acoustic multilayer film 42 may be the first layer. The layer adjacent to the first layer may be the second layer. In this case, the intermediate layer may include only the first layer, or may be a laminated body including the first layer and the second layer. When the combinations of the magnitude relationship between the acoustic impedances of the piezoelectric layer 14, the first layer, and the second layer and the thickness td are as shown in Table 3, the ripples in the frequency characteristic can be reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device defining a filter device with a pass band, the acoustic wave device comprising:

a laminated substrate including a first layer and a second layer, the first layer laminated on the second layer;

a piezoelectric layer laminated on the first layer of the laminated substrate; and an excitation electrode on the piezoelectric layer; wherein the laminated substrate includes a support substrate;

the first layer is a dielectric layer and is included in an intermediate layer laminated on the piezoelectric layer;

the intermediate layer is a laminated body including the first layer and the second layer;

when a center frequency in the pass band of the filter device is defined as fc, an acoustic velocity of a transversal wave propagating in at least one layer included in the intermediate layer is defined as vi, a thickness of the at least one layer is defined as ti, and any one of natural numbers is denoted by m, the thickness ti is within a range of $(vi/fc)\times(1/2)\times(m\pm0.3)$; and when an acoustic velocity of a transversal wave propagating through the first layer is defined as v, a frequency included in the pass band of the filter device is defined as f, a wavelength derived from v/f is defined as λ, an acoustic impedance of the piezoelectric layer is defined as Zp, an acoustic impedance of the first layer is defined as Zd, an acoustic impedance of the second layer is defined as Zs, a thickness of the first layer is defined as td, and any one of natural numbers is denoted by n, combinations of a magnitude relationship of acoustic impedances of the piezoelectric layer, the first layer, and the second layer, and the thickness td are as shown in Table 1:

TABLE 1

| Magnitude Relationship of Acoustic Impedance | Zp > Zd | Zp < Zd |
|---|---|---|
| Zs > Zd | td = n (½) λ | td = (2n − 1) (14) λ |
| Zs < Zd | td = (2n − 1) (¼) λ | td = n (½) λ. |

2. The acoustic wave device according to claim 1, wherein the second layer includes silicon.

3. The acoustic wave device according to claim 2, wherein a plane orientation of the silicon is (100).

4. The acoustic wave device according to claim 1, wherein at least one layer included in the intermediate layer is a silicon oxide layer or a silicon oxycarbide layer.

5. The acoustic wave device according to claim 1, wherein a cavity portion is provided in the laminated substrate, and at least a portion of the excitation electrode overlaps the cavity portion in a plan view.

6. The acoustic wave device according to claim 1, wherein the piezoelectric layer is a lithium tantalate layer or a lithium niobate layer.

7. The acoustic wave device according to claim 1, wherein the excitation electrode is an IDT electrode including a plurality of electrode fingers.

8. The acoustic wave device according to claim 7, wherein the acoustic wave device is structured to generate plate waves.

9. The acoustic wave device according to claim 7, wherein when a thickness of the piezoelectric layer is defined as d and a center-to-center distance between the adjacent electrode fingers to each other is defined as p, d/p is equal to or less than about 0.5.

10. The acoustic wave device according to claim 9, wherein d/p is equal to or less than about 0.24.

11. The acoustic wave device according to claim 9, wherein, when viewed from a direction in which the plurality of electrode fingers faces each other, a region where the adjacent electrode fingers overlap each other is an excitation region, and a metallization ratio of the plurality of electrode fingers with respect to the excitation region is defined as MR, $MR \leq$ about 1.75 (d/p)+0.075 is satisfied.

12. The acoustic wave device according to claim 9, wherein the piezoelectric layer is a lithium tantalate layer or a lithium niobate layer; and Euler angles (φ, θ, ψ) of lithium niobate or lithium tantalate forming the piezoelectric layer are in a range of the following Expression (1), Expression (2), or Expression (3):

$$(0°\pm10°, 0° \text{ to } 20°, \text{arbitrary } \psi) \quad \text{Expression (1)}$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad \text{Expression (2)}$$

$$(0°\pm10°, [180°-30° (1-(\psi-90)^2/8100)^{1/2}] \text{ to } 180°, \text{arbitrary } \psi) \quad \text{Expression (3).}$$

13. The acoustic wave device according to claim 1, wherein the piezoelectric layer includes a first main surface and a second main surface facing each other; and the excitation electrode includes an upper electrode on the first main surface of the piezoelectric layer and a lower electrode on the second main surface, the upper electrode and the lower electrode facing each other with the piezoelectric layer interposed between the upper electrode and the lower electrode.

14. The acoustic wave device according to claim 1, wherein the first layer includes silicon oxide.

15. The acoustic wave device according to claim 5, wherein the laminate structure includes another cavity.

16. The acoustic wave device according to claim 15, wherein the cavity and the another cavity are provided only in the first layer.

17. The acoustic wave device according to claim 5, wherein the cavity is defined by a through-hole in the first layer and a recess in the second layer.

* * * * *